(12) United States Patent
Yu et al.

(10) Patent No.: US 10,720,409 B2
(45) Date of Patent: Jul. 21, 2020

(54) SEMICONDUCTOR PACKAGES WITH THERMAL-ELECTRICAL-MECHANICAL CHIPS AND METHODS OF FORMING THE SAME

(71) Applicant: Taiwan Semiconductor Manufacturing Company, Ltd., Hsinchu (TW)

(72) Inventors: Chen-Hua Yu, Hsinchu (TW); Der-Chyang Yeh, Hsinchu (TW); Hsien-Wei Chen, Hsinchu (TW); Li-Hsien Huang, Zhubei (TW); Yueh-Ting Lin, Taipei (TW); Wei-Yu Chen, New Taipei (TW); An-Jhih Su, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/051,311

(22) Filed: Jul. 31, 2018

(65) Prior Publication Data
US 2018/0374824 A1    Dec. 27, 2018

Related U.S. Application Data

(62) Division of application No. 15/366,654, filed on Dec. 1, 2016.

(Continued)

(51) Int. Cl.
*H01L 25/065* (2006.01)
*H01L 25/04* (2014.01)
(Continued)

(52) U.S. Cl.
CPC ...... *H01L 25/0657* (2013.01); *H01L 23/3738* (2013.01); *H01L 24/19* (2013.01);
(Continued)

(58) Field of Classification Search
CPC ............... H01L 25/043; H01L 25/0657; H01L 25/0756; H01L 23/4012; H01L 2224/49174
See application file for complete search history.

(56) References Cited

U.S. PATENT DOCUMENTS

| 8,361,842 B2 | 1/2013 | Yu et al. |
| 8,680,647 B2 | 3/2014 | Yu et al. |

(Continued)

FOREIGN PATENT DOCUMENTS

| CN | 102593110 A | 7/2012 |
| CN | 102931173 A | 2/2013 |

(Continued)

OTHER PUBLICATIONS

Yu, et al., U.S. Appl. No. 15/058,818, entitled "Devices Employing Thermal and Mechanical Enhanced Layers and Methods of Forming Same," filed Mar. 2, 2016.

*Primary Examiner* — Phat X Cao
(74) *Attorney, Agent, or Firm* — Slater Matsil, LLP

(57) ABSTRACT

In some embodiments, a device includes a thermal-electrical-mechanical (TEM) chip having a functional circuit, a first die attached to a first side of the TEM chip, and a first via on the first side of the TEM chip and adjacent to the first die, the first via being electrically coupled to the TEM chip. The device also includes a first molding layer surrounding the TEM chip, the first die and the first via, where an upper surface of the first die and an upper surface of the first via are level with an upper surface of the first molding layer. The device further includes a first redistribution layer over the (Continued)

upper surface of the first molding layer and electrically coupled to the first via and the first die.

20 Claims, 24 Drawing Sheets

Related U.S. Application Data

(60) Provisional application No. 62/376,726, filed on Aug. 18, 2016.

(51) Int. Cl.
*H01L 23/00* (2006.01)
*H01L 23/373* (2006.01)
*H01L 25/10* (2006.01)
*H01L 25/00* (2006.01)
*H01L 23/538* (2006.01)
*H01L 23/498* (2006.01)

(52) U.S. Cl.
CPC .............. *H01L 24/20* (2013.01); *H01L 24/97* (2013.01); *H01L 25/043* (2013.01); *H01L 25/0652* (2013.01); *H01L 25/105* (2013.01); *H01L 25/50* (2013.01); *H01L 23/49816* (2013.01); *H01L 23/5389* (2013.01); *H01L 24/29* (2013.01); *H01L 24/32* (2013.01); *H01L 24/48* (2013.01); *H01L 24/73* (2013.01); *H01L 24/92* (2013.01); *H01L 2224/04105* (2013.01); *H01L 2224/12105* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83* (2013.01); *H01L 2224/92244* (2013.01); *H01L 2224/97* (2013.01); *H01L 2225/0651* (2013.01); *H01L 2225/06548* (2013.01); *H01L 2225/06568* (2013.01); *H01L 2225/06589* (2013.01); *H01L 2225/1035* (2013.01); *H01L 2225/1041* (2013.01); *H01L 2225/1058* (2013.01); *H01L 2225/1094* (2013.01); *H01L 2924/1033* (2013.01); *H01L 2924/10252* (2013.01); *H01L 2924/10253* (2013.01); *H01L 2924/10271* (2013.01); *H01L 2924/10329* (2013.01); *H01L 2924/10337* (2013.01); *H01L 2924/14* (2013.01); *H01L 2924/1421* (2013.01); *H01L 2924/1431* (2013.01); *H01L 2924/1432* (2013.01); *H01L 2924/1434* (2013.01); *H01L 2924/1436* (2013.01); *H01L 2924/14335* (2013.01); *H01L 2924/15311* (2013.01); *H01L 2924/181* (2013.01); *H01L 2924/3511* (2013.01)

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2006/0148130 | A1 | 7/2006 | Urakawa |
| 2008/0174008 | A1* | 7/2008 | Yang .................. G11C 5/02 257/723 |
| 2011/0291288 | A1 | 12/2011 | Wu et al. |
| 2013/0026468 | A1 | 1/2013 | Yoshimuta et al. |
| 2013/0037950 | A1 | 2/2013 | Yu et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0103488 | A1 | 4/2014 | Chen et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264831 | A1 | 9/2014 | Meyer |
| 2014/0264930 | A1 | 9/2014 | Yu et al. |
| 2016/0247784 | A1* | 8/2016 | Wang .................. H01L 24/19 |
| 2016/0322332 | A1 | 11/2016 | Kim et al. |
| 2017/0084541 | A1 | 3/2017 | Hsu et al. |
| 2017/0103968 | A1 | 4/2017 | Prabhu et al. |
| 2017/0117263 | A1 | 4/2017 | Yeh et al. |
| 2017/0207197 | A1 | 7/2017 | Yu et al. |

FOREIGN PATENT DOCUMENTS

| | | |
|---|---|---|
| CN | 103730434 A | 4/2014 |
| WO | 2009022991 A1 | 2/2009 |

* cited by examiner

SEMICONDUCTOR PACKAGES WITH THERMAL-ELECTRICAL-MECHANICAL CHIPS AND METHODS OF FORMING THE SAME

PRIORITY CLAIM

This application is a divisional of U.S. patent application Ser. No. 15/366,654, filed on Dec. 1, 2016 and entitled "Semiconductor Packages with Thermal-Electrical-Mechanical Chips and Methods of Forming the Same," which claims the benefit of U.S. Provisional Application No. 62/376,726, filed on Aug. 18, 2016 and entitled "Thermal-Electrical-Mechanical Chips Embedded In Wafer Level Fan-Out Technology," which applications are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. This high level of integration from PoP technology enables production of semiconductor devices with enhanced functionalities and small footprints.

Due to the mismatch of the coefficients of thermal expansion (CTE) for different materials of the semiconductor packages, warpage of semiconductor packages may occur. Left uncontrolled, warpage may damage the semiconductor packages and result in reduced yields of semiconductor manufacturing. There is a need in the art for structures of and manufacturing methods for semiconductor packages with reduced warpage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
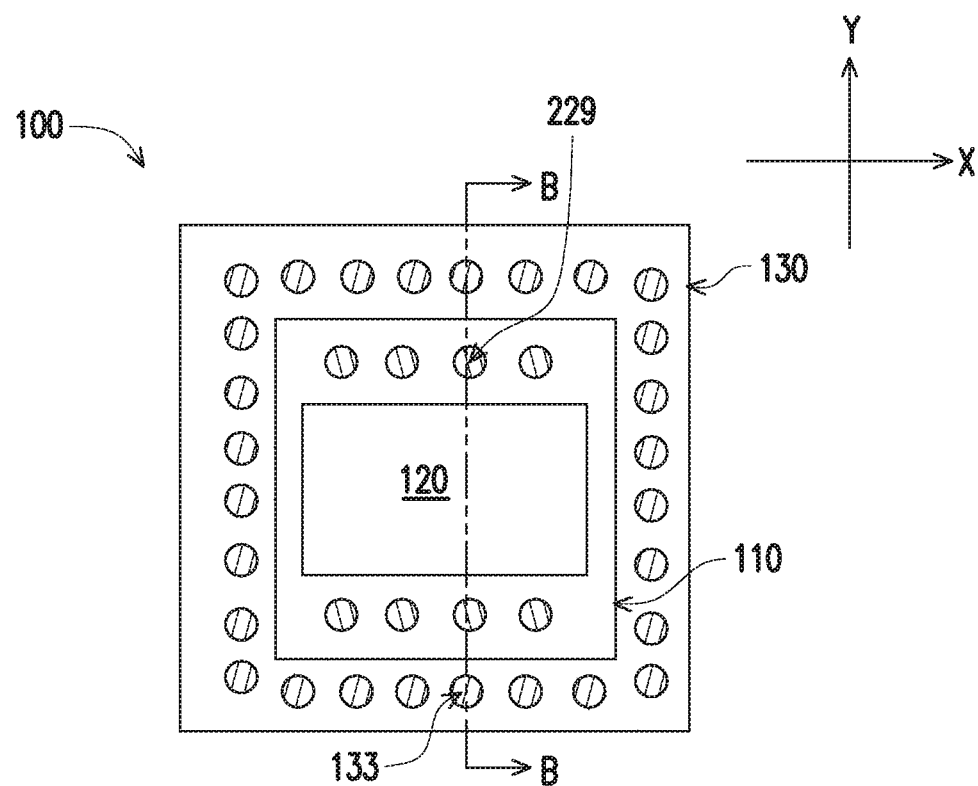
FIGS. 1A and 1B illustrate a top view and a cross-sectional view, respectively, of a semiconductor package with a thermal-electrical-mechanical (TEM) chip at a certain stage of fabrication, in accordance with an embodiment.
Figure 1B:
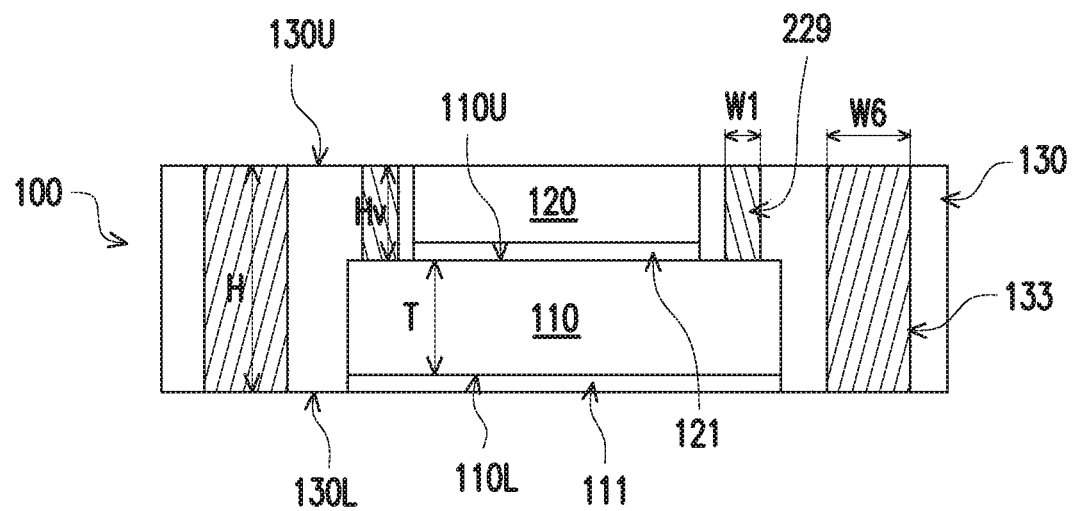

FIGS. 1A and 1B illustrate a top view and a cross-sectional view, respectively, of a semiconductor package 100 with a thermal-electrical-mechanical (TEM) chip 110 at a certain stage of fabrication. FIG. 1B is a cross-sectional view of semiconductor package 100 illustrated in FIG. 1A along line B-B, and FIG. 1A is a top view of the semiconductor package illustrated in FIG. 1B.

Referring to FIG. 1A and FIG. 1B, a die 120 (also referred to as a semiconductor die, a chip, an integrated circuit (IC), or an IC die) is attached to an upper surface 110U of a TEM chip 110 (also referred to as a TEM die) by a dielectric adhesive layer 121 such as a glue layer or a die attaching film (DAF). Vertical connectors 229, which may also be referred to as vias, are formed on upper surface 110U of TEM chip 110 and are electrically coupled to TEM chip 110. Molding layer 130 surrounds TEM chip 110, die 120, and vertical connectors 229. Vias 133 may be formed extending through molding layer 130. Note that for clarify, portions of molding layer 130 disposed over upper surface 110U of TEM chip 110 are not shown in FIG. 1A. FIG. 1B also illustrates a dielectric layer 111 on lower surface 110L of TEM chip 110, which dielectric layer 111 may be a glue layer or a DAF. Additional layers or structures, e.g., a redistribution layer (RDL) (not shown, see, e.g., RDL 250 in FIG. 4), may be formed over the upper surface 130U of molding layer 130 and electrically coupled to die 120, vias 133, and TEM chip 110 (e.g., through vertical connectors 229), in some embodiments.

TEM chip 110 is a semiconductor die comprising a rigid material (e.g., Si, Ge, SiGe, GaN, GaAs, or InGnAs), which rigid materials have a small CTE (e.g., CTE<3 ppm/° C.), in some embodiments. The small CTE of TEM chip 110 helps to reduce the warpage of semiconductor packages, as discussed in more detail hereinafter. In the present disclosure, TEM chip 110 has a functional circuit therein, which includes electrical devices (e.g., active devices and/or passive devices) formed in or on a semiconductor substrate (e.g., Si) and interconnected by electrically conductive lines and/or vias to perform certain design functions. For example, TEM chip 110 may include active devices (e.g., transistors) and/or passive devices (e.g., resistor, capacitor, inductors) formed in/on a silicon (Si) substrate and connected by interconnect structures (e.g., conductive lines and vias) formed in metal layers over the substrate.

TEM chip 110 may be a logic die (e.g., central processing unit, microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), combinations thereof, or the like, as examples.

In some embodiments, TEM chip 110 has a thickness T (see FIG. 1B) ranging from about 50 μm to about 250 μm. In other embodiments, TEM chip 110 has a thickness T ranging from about 50 μm to about 150 μm, although other dimensions are also possible. In accordance with an embodiment, the lower portions of TEM chip 110 (e.g., the portions proximate lower surface 110L of TEM chip 110) comprise a rigid bulk material, such as bulk silicon. The lower portions of TEM chip 110 comprise over about 90% of the total thickness T of TEM chip 110, in some embodiments. In the illustrated embodiment above, electrical devices (e.g., transistors, resistors, capacitors, inductors) are formed in the top portions (the portions proximate upper surface 110U) of TEM chip 110. The top portions of TEM chip 110 comprise less than about 10% of the total thickness T of TEM chip 110, in some embodiments. For example, active devices may be formed in the top portions of TEM chip 110, which top portions may have a thickness from about 5 μm to about 10 μm. As another example, passive devices may be formed in the top portions of TEM chip 110, which top portions may have a thickness from about 20 μm to about 30 μm.

TEM chip 110 has a surface area larger than a surface area of die 120 attached to TEM chip 110, as illustrated in FIG. 1A. For example, in the top view of FIG. 1A, die 120 is disposed within a boundary of TEM chip 110. In other embodiments, more than one dies 120 are attached to upper surface 110U of TEM chip 110 (see, e.g., FIGS. 17, 22 and 23 and the description thereof), in which case the surface area of TEM chip 110 is larger than the sum of the surface areas of all the dies 120 attached to the surface (e.g., upper surface 110U with bonding pads formed thereon) of TEM chip 110. A large surface area of TEM chip 110 may correspond to a large size (e.g., volume) for TEM chip 110, which may advantageously reduce the warpage of semiconductor package 100, as describe below. For example, the surface area (e.g., area of upper surface 110U) of TEM chip 110 may be about 1.1 to about 5 times larger than the surface area (e.g., the upper surface area or lower surface area) of die 120. In cases where two or more dies are attached to the upper surface of TEM chip 110, the surface area of TEM chip 110 is about 1.1 to about 5 times the sum of the surface areas of the two or more dies. In some embodiments, the volume of the TEM chip is between 50% to about 95% of the total volume of semiconductor package 100.

As chip sizes continue to shrink due to higher level of integration, the fan-out ratio (e.g., ratio of the surface area of a semiconductor package to the surface area of the semiconductor chip inside the semiconductor package) of semiconductor packages may increase. This is because as the chip sizes (e.g., volumes) decrease, the relative amount (e.g., percentage of volume) of molding material in the semiconductor packages may have to increase to provide enough surface area to accommodate the interconnect structures (e.g., RDLs and through molding vias) and the external connectors of the semiconductor packages. Large fan-out ratio may induce excessive wafer level and package level warpage due to the large (relative) amount of molding material used in the semiconductor package and the high CTE of molding material. For example, when molding material is cured, significant shrinkage may occur, which may cause large warpage in wafer level or package level or even damage semiconductor packages. Therefore, by using a large size (e.g., volume) for TEM chip 110, TEM chip 110 takes up spaces in semiconductor package 100 that were previously occupied by molding layer 130, thus reducing the amount of molding material in semiconductor package 100, which in turn reduces the warpage of the semiconductor package.

Additionally, recall that TEM chip 110 is made of a rigid material (e.g., Si) with a small CTE. Thus, a large TEM chip 110 helps to reduce the overall CTE of semiconductor package 100. In addition, since die 120 is attached to the upper surface 110U of TEM chip 110, the rigid structure of TEM chip 110 acts as a template and forces die 120 to stay straight (e.g., not warped) during thermal cycles.

As illustrated in FIG. 1A, TEM chip 110 has a 1:1 aspect ratio (e.g., having a same dimension in the X-axis and Y-axis directions in FIG. 1A), in some embodiments. For example, TEM chip 110 has a square shape in the top view of FIG. 1A. The 1:1 aspect ratio of TEM chip 110 may alleviate the asymmetric package warpage. In conventional semiconductor package, when the chip encapsulated by the molding material of the semiconductor package does not have a 1:1 aspect ratio (e.g., having a rectangular shape in a top view), asymmetric package warpage might occur due to the different amount of molding material in the X-direction and Y-direction of the package. The TEM chip 110 in semiconductor package 100, with a 1:1 aspect ratio, reduces the asymmetry of molding material in the X-direction and Y-direction of the package, thereby reducing the asymmetric package warpage. While a 1:1 aspect ratio may be a target aspect ratio, it is understood that due to various factors, such as design constraints and manufacturing precision, TEM chip 110 may have an aspect ratio proximate to 1:1 (e.g., slightly larger than 1:1 or slightly smaller than 1:1). These variations of the aspect ratio are fully intended to be included within the scope of the present disclosure.

As illustrated in FIGS. 1A and 1B, vertical connectors 229 are formed on upper surface 110U of TEM chip 110 and are electrically coupled to TEM chip 110. In some embodiments, vertical connectors 229 are electrically coupled to TEM chip 110 through bonding pads (not shown in FIGS. 1A and 1B, see, e.g., bonding pad 223 in FIG. 3) on upper surface 110U of TEM chip 110. In the illustrated embodiment, vertical connectors 229 are formed on upper surface 110U and along perimeters (e.g., sidewalls) of TEM chip 110, and the center region of upper surface 110U of TEM chip 110 is free of vertical connectors 229, thus leaving space in the center region for attaching die 120.

TEM chip 110 is electrically coupled to other chips, packages, or power sources (e.g., power supply and electrical ground) through vertical connectors 229. Note that die 120 is attached to upper surface 110U of TEM chip 110 by dielectric layer 121 (e.g., a glue layer or a DAF). Therefore, no external connector or solder joint is formed between upper surface 110U of TEM chip 110 and die 120. The active side of die 120 (e.g., the side with bonding pads for electrical connections) is level with upper surface 130U of molding layer 130 and the upper surfaces of vertical connectors 229 and via 133, in some embodiments. A subsequently formed RDL over upper surface 130U (see, e.g., RDL 250 in FIG. 4) is electrically coupled to TEM chip 110 (e.g., through vertical connectors 229), die 120, and vias 133, in some embodiments.

Compared with through-molding vias 133, which have a height H the same as the thickness of molding layer 130 (e.g., vias 133 extend from lower surface 130L to upper surface 130U of molding layer 130), vertical connectors 229 have a smaller height Hv, and extend from upper surface 110U of TEM chip 110 to upper surface 130U of molding layer 130. A width W1 of vertical connectors 229 is smaller than a width W6 of through-molding vias 133, in some embodiments. Formation methods of vertical connectors 229 are described hereinafter with reference to FIG. 3.

Die 120 may be any suitable semiconductor die, such as a logic die, a memory die, a power management die, an RF die, a sensor die, a MEMS die, a signal processing die, a front-end die, combinations thereof, or the like, as examples. In other embodiments of the present disclosure, a semiconductor package may be attached to TEM chip 110 at locations where die 120 is shown in FIGS. 1A and 1B. The semiconductor package attached to TEM chip 110 may include one or more dies encapsulated in a molding material, and may comprise RDLs over the molding material of the semiconductor package and through-molding vias in the molding material of the semiconductor package. The size (e.g., surface area, and/or volume) of the semiconductor package attached to TEM chip 110 is small (e.g., the volume of the semiconductor package is between about 20% and about 70% of the volume of TEM chip 110) compared with the size of TEM chip 110, such that TEM chip 110 still dominates semiconductor package 100 and provides the advantage of warpage reduction, in the illustrated embodiments. Therefore, the advantages of TEM chip 110 may apply regardless of whether a die 120 or a semiconductor package is attached to TEM chip 110. Therefore, in the description hereinafter, semiconductor dies (e.g., die 120 in FIGS. 1A/1B, die 230 in FIG. 3, and dies 370/380 in FIG. 16) are used in the various embodiments for attaching to the corresponding TEM chip, with the understanding that semiconductor packages may also be used in place of the semiconductor dies to form the various packages (e.g., MUST package, MUST-PoP package) illustrated in the various embodiments of the present disclosure.

FIGS. 2-7 illustrate cross-sectional views of a multi-stacked (MUST) package 200 with a TEM chip at various stages of fabrication, in accordance with an embodiment. For simplicity, only one MUST package is illustrated in FIGS. 2-7, with the understanding that tens of, hundreds of, or even thousands of semiconductor packages 200 may be formed over carrier 210. In the description herein, a TEM chip is expressly referred to as a TEM chip.

Figure 2:
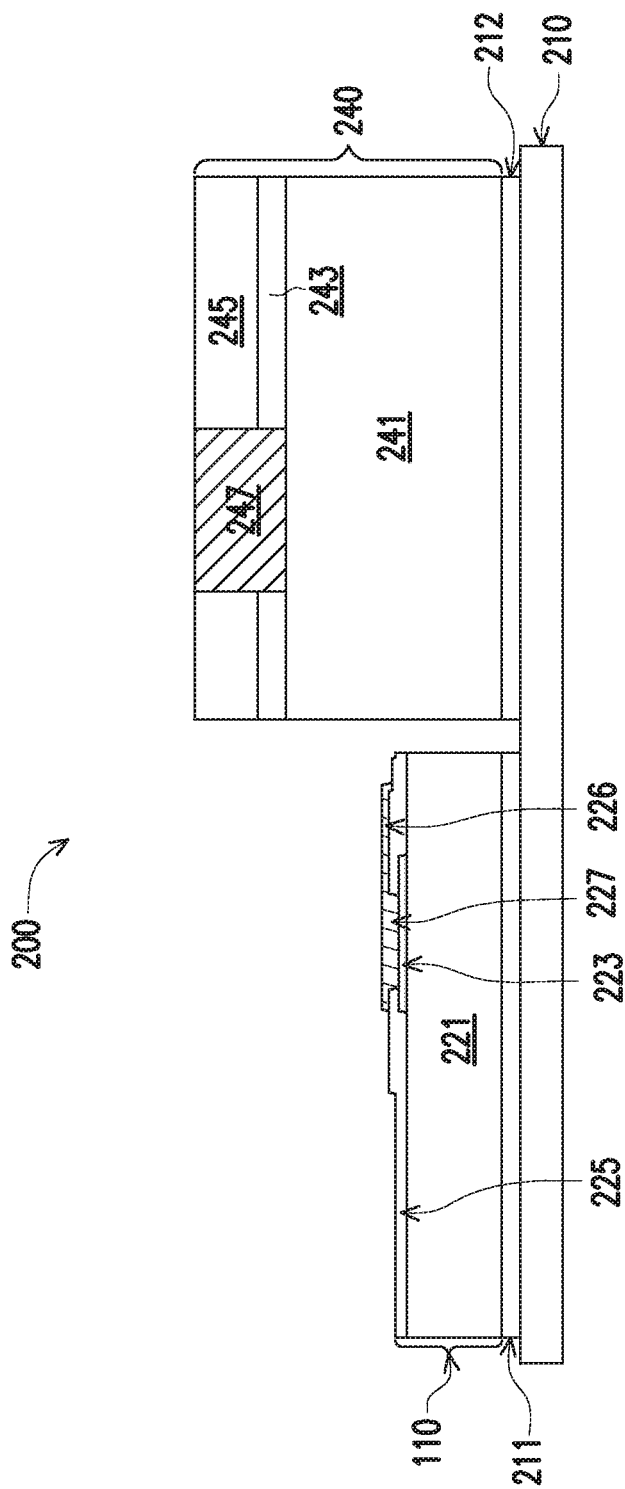
FIGS. 2-7 illustrate cross-sectional views of a multi-stacked (MUST) package with a TEM chip at various stages of fabrication, in accordance with an embodiment.

Referring to FIG. 2, the TEM chip 110 is attached to a carrier 210 by a dielectric adhesive layer 211 in a first region of carrier 210, and a die 240 is attached to carrier 210 by another dielectric adhesive layer 212 in a second region of carrier 210. Carrier 210 may contain base material such as silicon, polymer, polymer composite, metal foil, ceramic, glass, glass epoxy, beryllium oxide, tape, or other suitable material for structural support. In some embodiments, carrier 210 is made of glass. Adhesive layer 211 and adhesive layer 212 may be deposited or laminated over carrier 210, in some embodiments. The adhesive layer 211 or adhesive layer 212 may be photosensitive and may be easily detached from carrier 210 by shining an ultra-violet (UV) light on carrier 210 in a subsequent carrier de-bonding process. For example, adhesive layer 211 or adhesive layer 212 may be a light-to-heat-conversion (LTHC) coating made by 3M Company of St. Paul, Minn.

As illustrated in more details in FIG. 2, TEM chip 110 includes one or more semiconductor layers 221 having electrical circuits formed therein, bonding pads 223 electrically coupled to the electrical circuits of TEM chip 110, and passivation layer 225 over bonding pads 223 and the one or more semiconductor layers 221. In some embodiments, TEM chip 110 also includes conductive pads 227 electrically coupled to bonding pads 223. Conductive pads 227 may additionally include a portion that extends laterally toward the perimeters (e.g., sidewalls) of TEM chip 110, which portion is sometimes referred to as conductive path 226.

Before being adhered to adhesive layer 211, TEM chip 110 may be processed according to applicable manufacturing processes to form integrated circuits in TEM chip 110. For example, active devices (e.g., transistors) and/or passive devices (e.g., resistor, capacitor, inductors) are formed in/on a rigid substrate (e.g., Si) with a low CTE (e.g., less than 3 ppm/° C.), and are interconnected by interconnect structures (e.g., conductive lines and vias) formed in metal layers over the substrate to form integrated circuits.

As illustrated in FIG. 2, TEM chip 110 further comprises bonding pads 223, such as aluminum pads or copper pads, to which external electrical connections are made. Bonding pads 223 are on the active side of the TEM chip 110 and are electrically coupled to the integrated circuits of TEM chip 110. Passivation layer 225 is on the active side of TEM chip 110 and on portions of bonding pads 223. Openings are through the passivation layer 225 to bonding pads 223. Conductive pads 227 (e.g., comprising a metal such as copper) are in the openings through passivation layer 225 and are mechanically and electrically coupled to the respective bonding pads 223. Conductive pads 227 may be formed by, for example, plating, or the like. Conductive pads 227 are electrically coupled to the integrated circuits of TEM chip 110, e.g., through bonding pads 223.

Passivation layer 225 is on the active side of TEM chip 110, and is laterally coterminous with TEM chip 110, in some embodiments. Although illustrated as one layer in FIG. 2, passivation layer 225 may include a plurality of sub-layers, and may include a polymer such as PBO, polyimide, BCB, or the like; a nitride such as silicon nitride or the like; an oxide such as silicon oxide, PSG, BSG, BPSG, the like; or a combination thereof, and may be formed, for example, by spin coating, lamination, CVD, or the like.

As illustrated in FIG. 2, semiconductor die 240 is attached to a same side of carrier 210 as TEM chip 110 by the dielectric adhesive layer 212. Die 240 may include one or more semiconductor layers 241 having electrical devices (e.g., transistors, resistors, capacitors, and inductors) and interconnect structures formed thereon or therein, passivation film 243, dielectric material 245, and die connectors 247. Semiconductor die 240 may be any suitable semiconductor die, such as a logic die, a memory die, a power management die, an RF die, a sensor die, a MEMS die, a signal processing die, a front-end die, combinations thereof, or the like, as examples.

Before being adhered to the dielectric adhesive layer 212, the integrated circuit die 240 may be processed according to applicable manufacturing processes to form integrated circuits in integrated circuit die 240. For example, integrated circuit die 240 includes a semiconductor substrate in the one or more semiconductor layers 241. The semiconductor substrate may include silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

The semiconductor die 240 further comprise bonding pads (not shown), such as aluminum pads or copper pads, to which external connections are made. The bonding pads are on what may be referred to as the active side of the integrated circuit die 240. Passivation film 243 is on the integrated circuit die 240 and on portions of the bonding pads. Openings are through the passivation film 243 to the bonding pads. Die connectors 247 (e.g., comprising a metal such as copper) are in the openings through passivation film 243 and are mechanically and electrically coupled to the respective bonding pads. Die connectors 247 may be formed by, for example, plating, or the like. Die connectors 247 are electrically coupled to the integrated circuits of die 240.

The dielectric material 245 is on the active sides of the integrated circuit die 240, such as on passivation film 243 and die connectors 247. Dielectric material 245 laterally encapsulates die connectors 247, and dielectric material 245 is laterally 10l coterminous with integrated circuit die 240. Dielectric material 245 may be a polymer such as PBO, polyimide, BCB, or the like; a nitride such as silicon nitride or the like; an oxide such as silicon oxide, PSG, BSG, BPSG, the like; or a combination thereof, and may be formed, for example, by spin coating, lamination, CVD, or the like.

The material and formation method for adhesive layer 212 may be similar to those of adhesive layer 211. Details are not repeated here.

Figure 3:
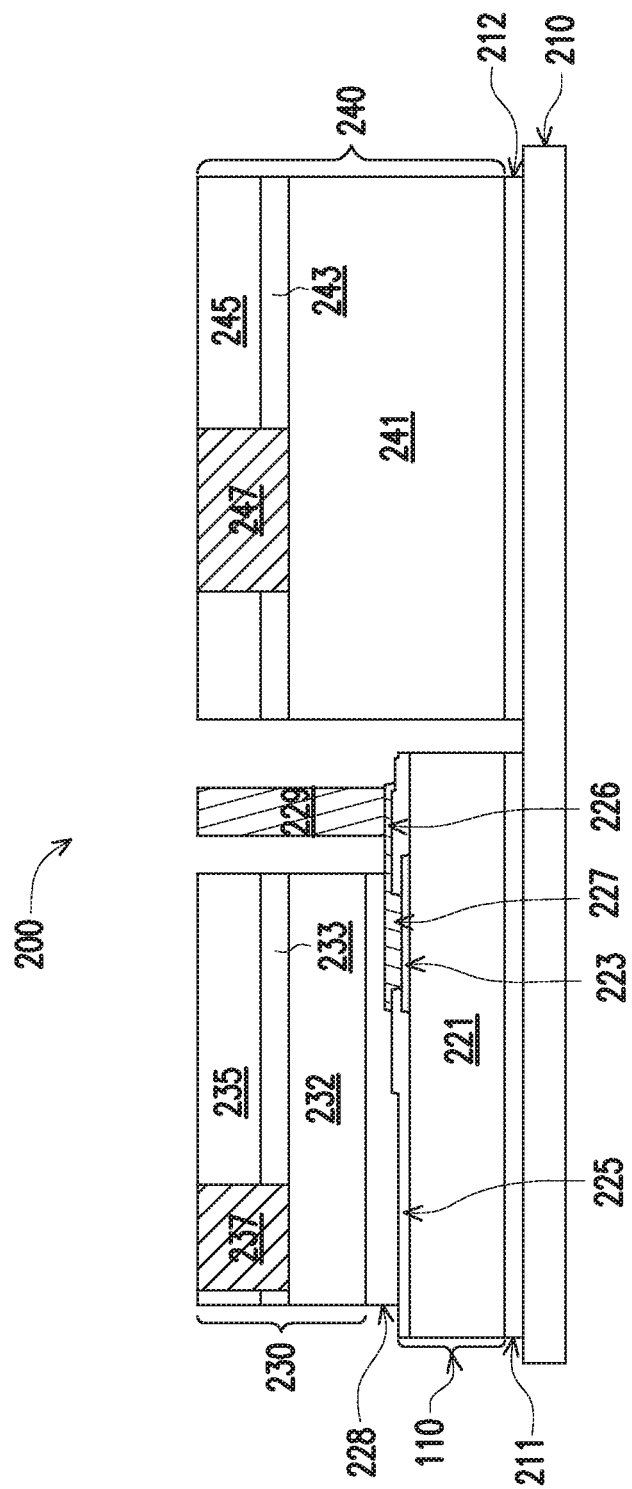

Next, as illustrated in FIG. 3, vertical connectors 229 of TEM chip 110 are formed on conductive paths 226, and another semiconductor die 230 is attached to the active side of TEM chip 110 by a dielectric adhesive layer 228. In other embodiments (not separately illustrated), vertical connectors 229 are formed on portions of conductive pads 227 directly above bonding pads 223. Although one vertical connector 229 is shown in FIG. 3, two or more vertical connectors 229 may be formed. As an example to form vertical connectors 229, a seed layer (not shown) is formed over the passivation layer 225. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the vertical connectors 229. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the vertical connectors 229. In other embodiments, the seed layer is not used, and conductive material is plated on conductive pads 227 or conductive path 226 (e.g., when conductive pads 227 or conductive path 226 comprises copper) at locations where vertical connectors 229 are to be formed. In the illustrated embodiment, vertical connectors 229 are formed before die 230 is attached to TEM chip 110. In other embodiments, vertical connectors 229 are formed after die 230 is attached to TEM chip 110.

Semiconductor die 230 may be any suitable semiconductor die, such as a logic die, a memory die, a power management die, an RF die, a sensor die, a MEMS die, a signal processing die, a front-end die, combinations thereof, or the like, as examples. Semiconductor die 230 is attached to TEM chip 110 with the active side of die 230 facing up (e.g., away from TEM chip 110). The materials and the formation methods of semiconductor die 230 and adhesive layer 228 may be similar to those of semiconductor die 240 and adhesive layer 211, respectively. Details are not repeated here.

Figure 4:
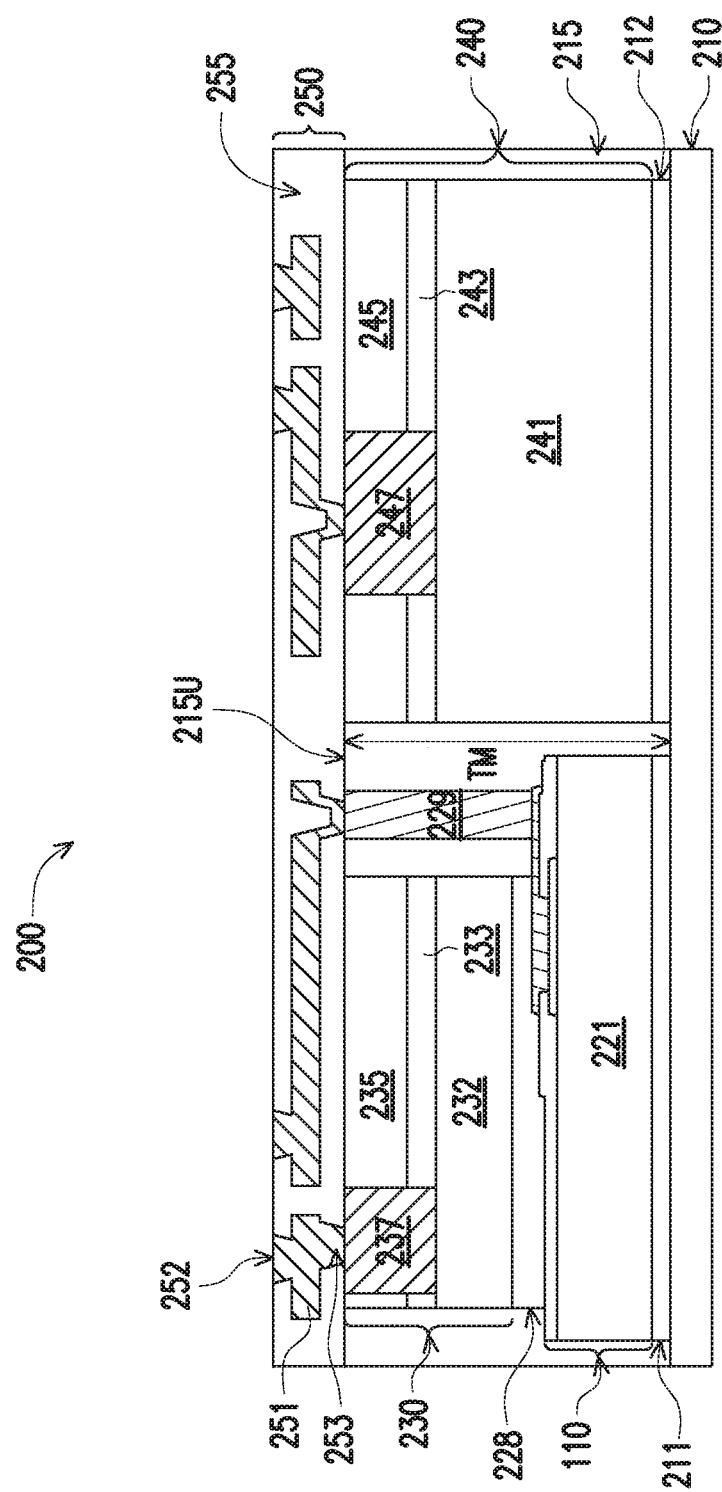

Next, as illustrated in FIG. 4, a first molding layer 215 is formed over carrier 210, and surrounds TEM chip 110, die 230, die 240, and vertical connectors 229 of TEM chip 110. In some embodiments, the thickness TM of first molding layer 215 is the same as a sum of the thickness of TEM chip 110, the thickness of die 230, the thickness of dielectric adhesive layer 211 and the thickness of dielectric adhesive layer 228, where the thicknesses are measured along the same direction as thickness TM. As illustrated in FIG. 4, an upper surface 215U of the first molding layer 215 is level with an upper surface of die 230 (e.g., upper surface of die connector 237 of die 230) and an upper surface of die 240 (e.g., upper surface of die connector 247 of die 240). Subsequently, an RDL 250 is formed over the first molding layer 215, TEM chip 110, die 230, die 240, and vertical connectors 229 of TEM chip 110.

The first molding layer 215 may be a molding compound, epoxy, or the like, and may be applied by compression molding, transfer molding, or the like. After curing, the first molding layer 215 may undergo a grinding process such as a chemical mechanical planarization (CMP) process to expose vertical connectors 229, die connector 237, and die connector 247. The upper surfaces of the vertical connectors 229, the upper surface of die connector 237, the upper surface of die connector 247, and the upper surface of first molding layer 215 are coplanar after the grinding process. In some embodiments, the grinding process may be omitted, for example, if vertical connectors 229, die connectors 237, and die connectors 247 are already exposed.

In FIG. 4, RDL 250 is formed over the first molding layer 215, vertical connectors 229, die 230 and die 240. The RDL 250 includes one or more dielectric layers 255 and electrically conductive features, such as conductive lines 251 and/or vias 253, formed inside the one or more dielectric layers 255. The conductive features of RDL 250 may extend beyond the boundaries (e.g., exterior perimeters or sidewalls) of die 230, die 240 and TEM chip 110, thus enabling the fan-out of die 230, die 240 and TEM chip 110. The conductive features of RDL 250 are electrically coupled to die 230 (e.g., through die connectors 237), die 240 (e.g., through die connector 247) and TEM chip 110 (e.g., through vertical connectors 229), and may provide electrical connections among die 230, die 240, and TEM chip 110, in some embodiments. Additionally, the conductive features of RDL 250 may include contact pads 252 proximate the upper surface of RDL 250 for electrical connection with other conductive features (e.g., vias 269 in FIG. 5) formed in subsequent processing.

The dielectric layers 255 of RDL 250 may be formed, for example, of a low dielectric constant (low-K) dielectric material, phosphosilicate glass (PSG), borophosphosilicate glass (BPSG), fluorinated silicate glass (FSG), SiOxCy, spin-on-glass, spin-on-polymers, silicon carbon material, PBO, polyimide, BCB, compounds thereof, composites thereof, combinations thereof, or the like, by any suitable method, such as spinning, CVD, plasma-enhanced CVD (PECVD), and/or lamination. The conductive lines 251 and conductive vias 253 may comprise copper, copper alloys, other metals or alloys, or combinations or multiple layers thereof, as examples, and may be formed using subtractive and/or damascene techniques, as examples. The conductive lines 251 and conductive vias 253 may be formed using one or more sputtering processes, photolithography processes, plating processes, and photoresist strip processes, as examples. Other methods can also be used to form the conductive features of RDL 250.

Figure 5:
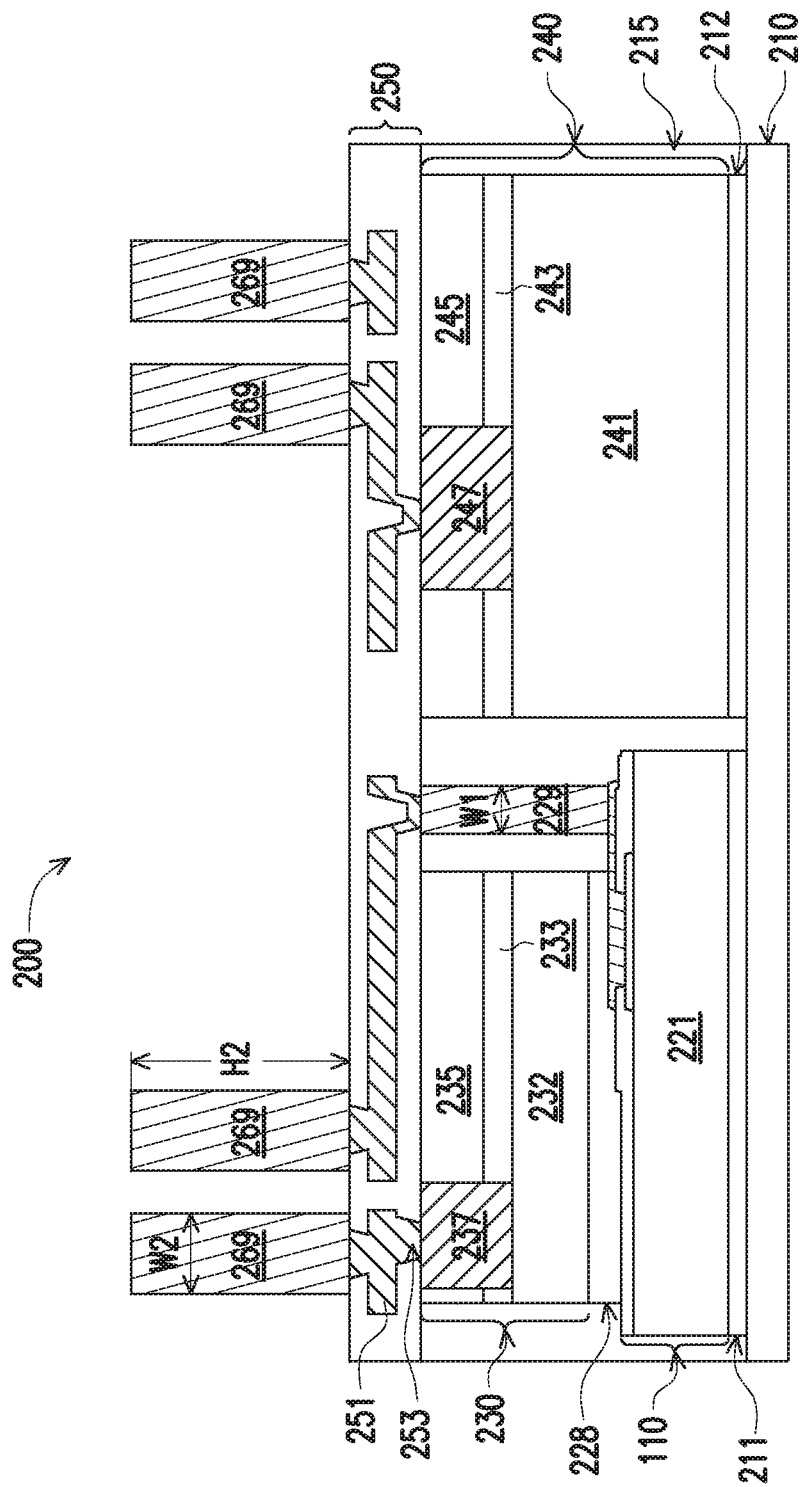

Next, in FIG. 5, vias 269 are formed over RDL 250 and are electrically coupled to the conductive features of RDL 250. The material and formation method of vias 269 may be similar to those of vertical connectors 229 of TEM chip 110. Note that unlike vertical connectors 229 which extend from the active side of TEM chip 110 to the upper surface of a respective molding layer (e.g., first molding layer 215), vias 269 extends from a first surface of a respective molding layer (e.g., second molding layer 259 in FIG. 7) contacting RDL 250 to a second surface of the respective molding layer opposing the first surface. In some embodiments, a height H2 of vias 269 is the same as a thickness H2 of second molding layer 259 (see FIG. 7) surrounding vias 269. In the illustrated embodiment, a width W2 of vias 269 is larger than a width W1 of vertical connectors 229, although W2 may also be equal to or smaller than W1 depending on, e.g., the aspect ratio of the photo resist used in forming the vias.

Figure 6:
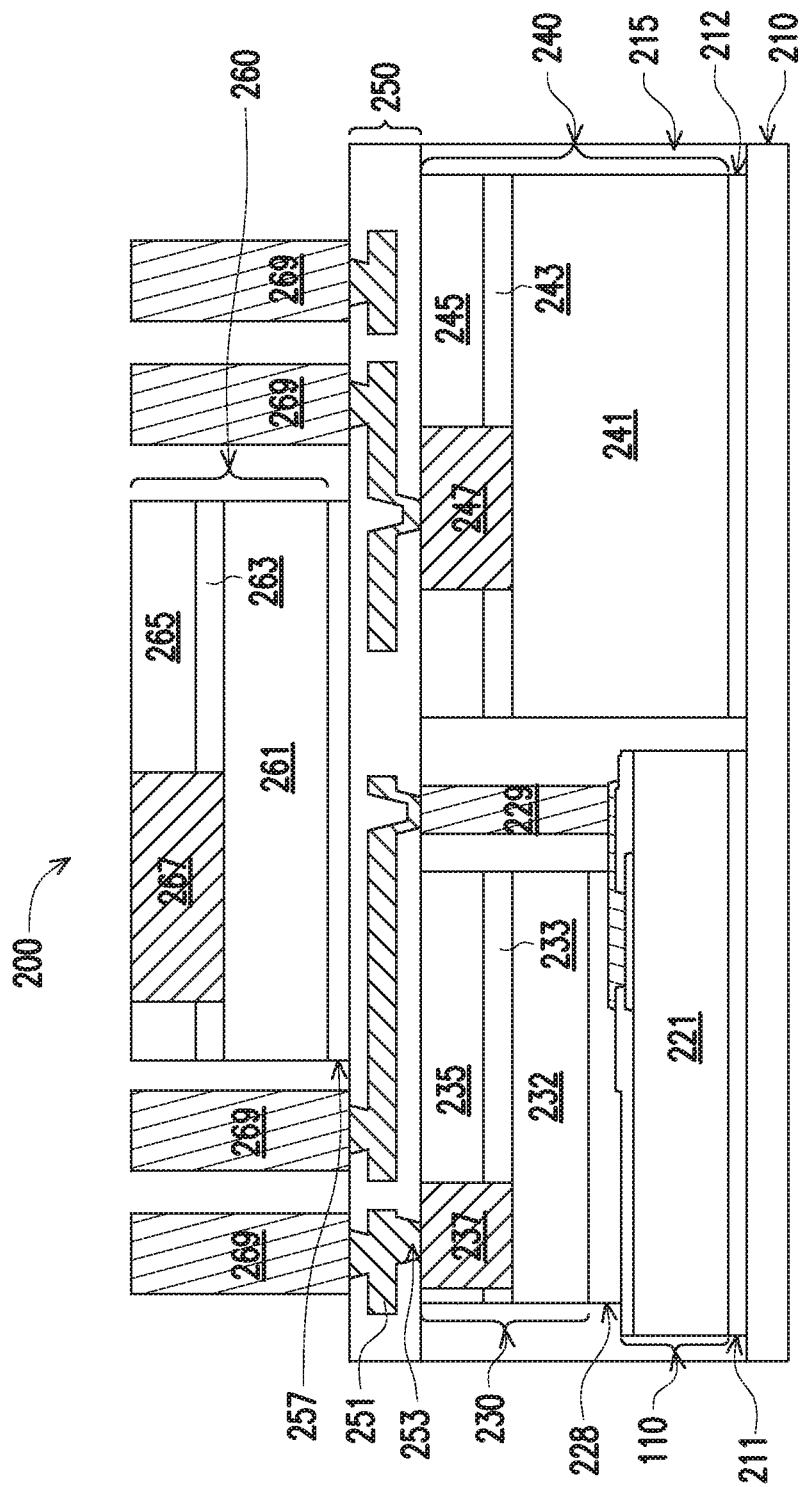

In FIG. 6, semiconductor die 260 is attached to RDL 250 by a dielectric layer such as an adhesive layer 257, with the active side of die 260 facing away from RDL 250. Semiconductor die 260 may be any suitable semiconductor die, such as a logic die, a memory die, a power management die, an RF die, a sensor die, a MEMS die, a signal processing die, a front-end die, combinations thereof, or the like, as examples. The materials and the formation methods of semiconductor die 260 and adhesive layer 257 may be similar to those of semiconductor die 240 and adhesive layer 211, respectively. Details are not repeated here.

Figure 7:
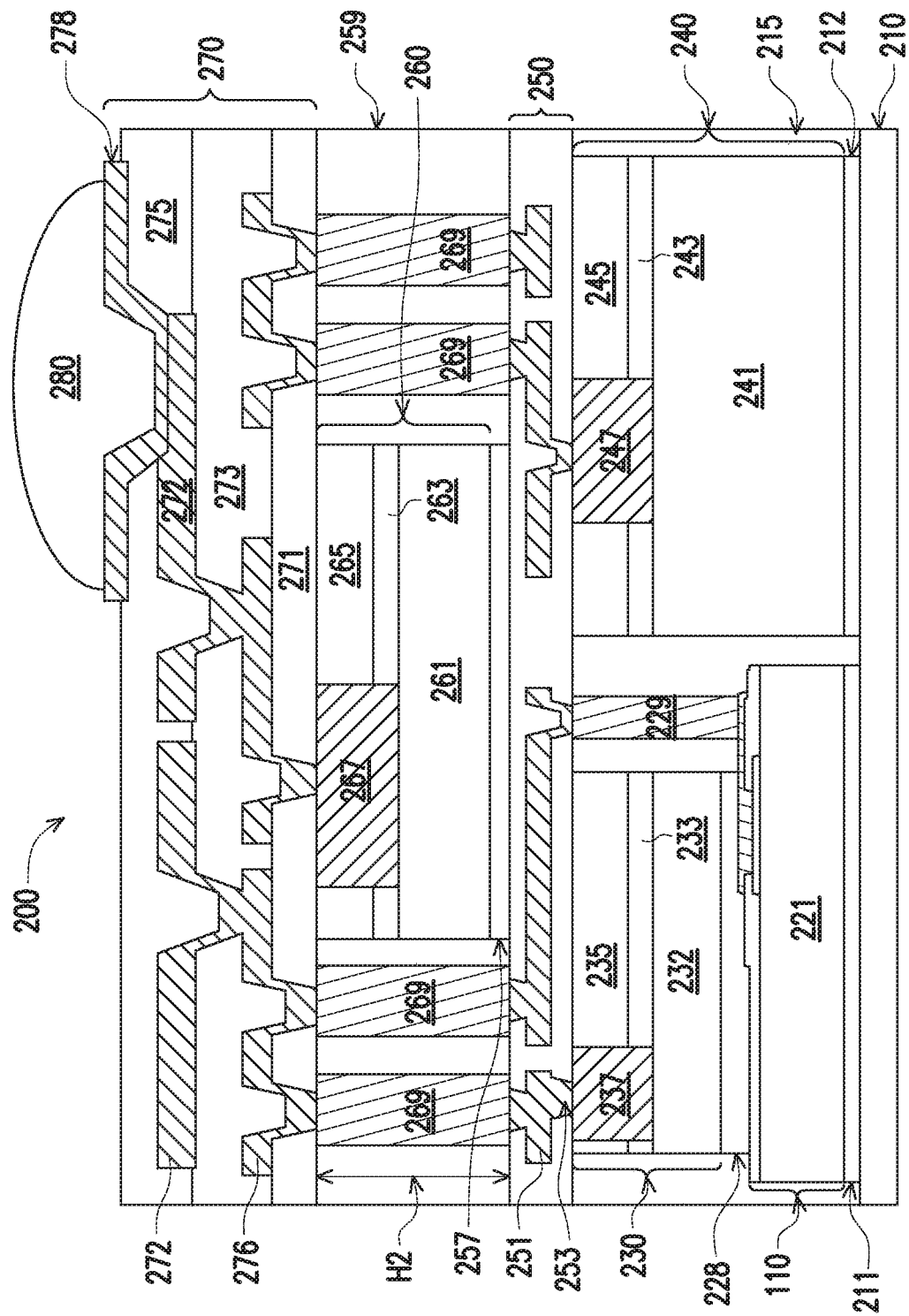

Next, in FIG. 7, the second molding layer 259 is formed over RDL 250. The second molding layer 259 surrounds vias 269 and semiconductor die 260. The deposited second molding layer 259 may undergo a curing process and a planarization process to expose vias 269 and die connector 267 of die 260. The material and the formation method of the second molding layer 259 may be similar to that of the first molding layer 215, details are not repeated here.

After the second molding layer 259 is formed, RDL 270 is formed over the second molding layer 259, vias 269, and die 260. As illustrated in FIG. 7, RDL 270 comprises a plurality of dielectric layers such as dielectric layer 271, dielectric layer 273, and dielectric layer 275, and conductive features such as conductive line 276 and conductive line 272. In the illustrated embodiment, conductive line 272 is conformally formed in a recess (e.g., the recess partially filled by conductive line 272) of dielectric layer 273 by, e.g., a plating process. RDL 270 may also include contact pads proximate the upper surface of RDL 270 for electrical connection with other devices or packages. In the illustrated embodiment, RDL 270 includes under-bump metallization (UBM) structures 278 proximate the upper surface of RDL 270. Although three dielectric layers 271/273/275 are shown in FIG. 7, any number of dielectric layers and any numbers of conductive lines may be formed in RDL 270.

As illustrated in FIG. 7, connectors 280 are electrically coupled to RDL 270 through, e.g., UBM 278. Connectors 280 may be placed on UBM 278 and may be a ball grid array (BGA) which comprises a eutectic material such as solder, although any suitable materials may be used. In an embodiment in which connectors 280 are solder balls, connectors 280 may be formed using a ball drop method, such as a direct ball drop process. Alternatively, the solder balls may be formed by initially forming a layer of tin through any suitable method such as evaporation, electroplating, printing, solder transfer, and then performing a reflow in order to shape the material into the desired bump shape. Once connectors 280 have been formed, a test may be performed to ensure that the structure is suitable for further processing.

Additional processing may follow the processing shown in FIG. 7. For example, the MUST package 200 shown in FIG. 7 may undergo a carrier de-bonding process to remove carrier 210 from the MUST package 200. As another example, a dicing processing may be performed after the carrier de-bonding process. Dicing singulates the plurality of semiconductor packages formed over carrier 210 into individual packages, in some embodiments.

FIGS. 8-18 illustrates cross-sectional views of a multi-stacked (MUST) semiconductor package 300 having a TEM chip at various stages of fabrication, in accordance with another embodiment. For simplicity, only one MUST package is illustrated in FIGS. 8-18, with the understanding that tens of, hundreds of, or even thousands of semiconductor packages may be formed over carrier 310.

Figure 8:
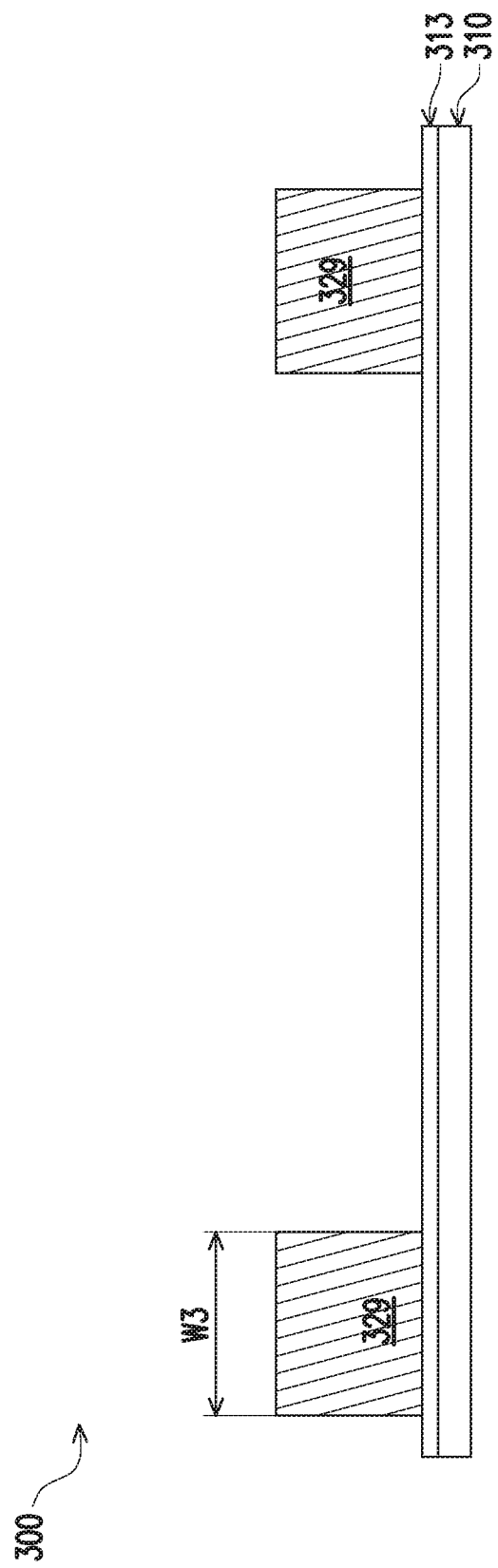
FIGS. 8-18 illustrate cross-sectional views of a MUST package with a TEM chip at various stages of fabrication, in accordance with another embodiment.

Referring to FIG. 8, a dielectric layer 313, such as an adhesive layer, or a polymer base buffer layer is formed over carrier 310 using spin coating, lamination, or other methods, as examples. Vias 329 are formed over dielectric layer 313. The material and formation method of vias 329 are similar to those of vias 269 in FIG. 5, in some embodiments.

Figure 9:
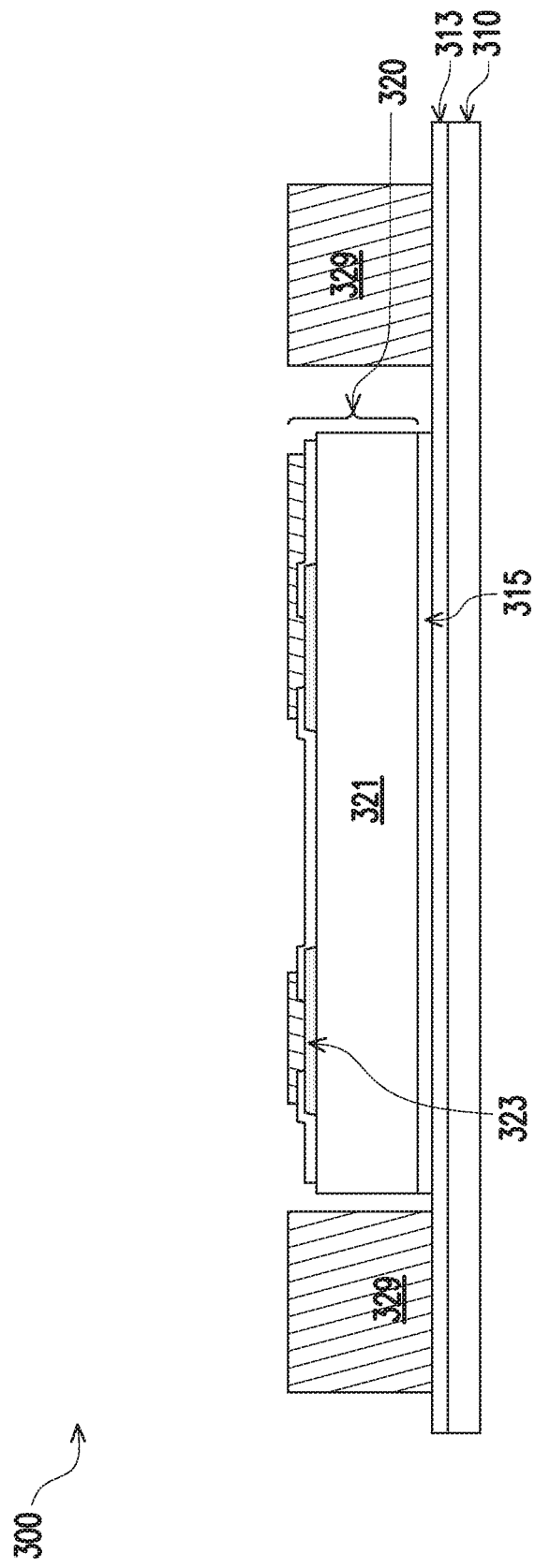

In FIG. 9, semiconductor die 320 is attached to dielectric layer 313 by, e.g., an dielectric adhesive layer 315. In an embodiment, the material and formation method of dielectric adhesive layer 315 are similar to those of dielectric adhesive layer 211 in FIG. 2. Semiconductor die 320 is disposed between vias 329, with the active side of die 320 (e.g., the side with bonding pads 323) facing away from dielectric layer 313, in some embodiments.

Figure 10:
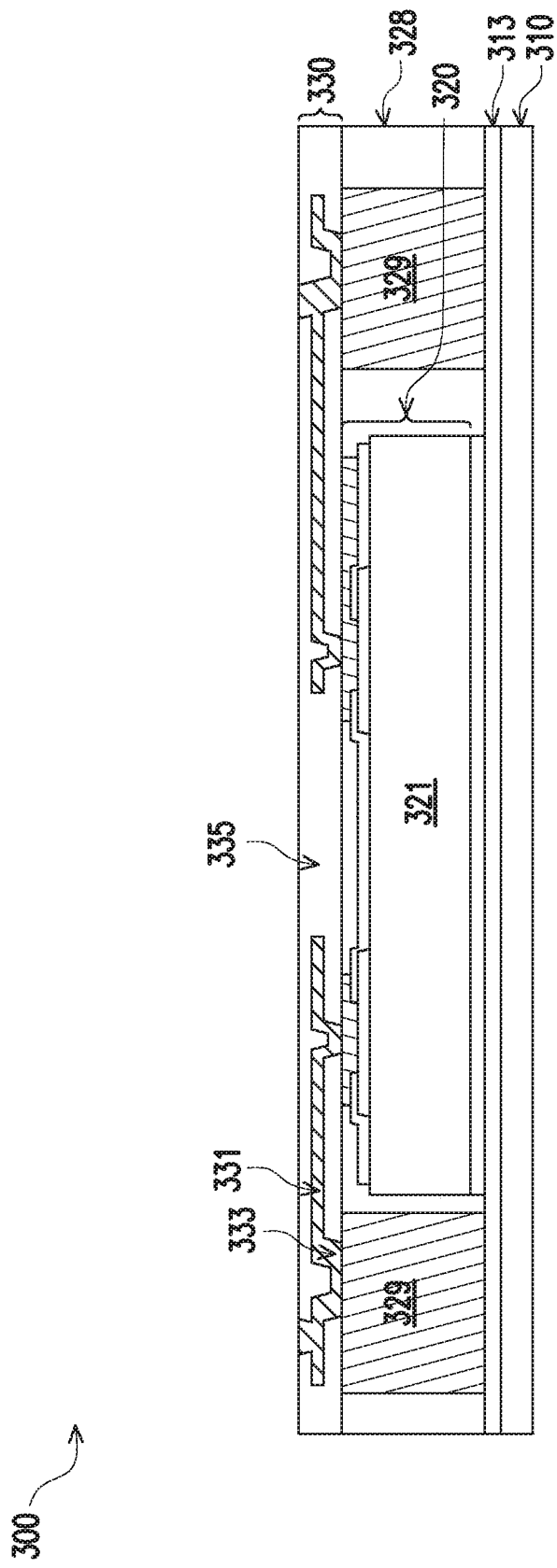

Next, as illustrated in FIG. 10, a first molding layer 328 is formed over dielectric layer 313. The first molding layer 328 surrounds vias 329 and die 320. The first molding layer 328 may be cured after being deposited, and may further undergo a planarization process (e.g., a CMP process) to obtain a planar upper surface that is level with upper surfaces of vias 329 and the upper surface of die 320. Subsequently, a RDL 330 is formed over the first molding layer 328, vias 329 and die 320. RDL 330 comprises conductive lines 331 and/or conductive vias 333 formed in one or more dielectric layer 335. In an embodiment, the material and formation method of RDL 330 are similar to those of RDL 250 in FIG. 5. RDL 330 is electrically coupled to vias 329 and die 320, and may provide electrical connections between die 320 and vias 329, in various embodiments.

Figure 11:
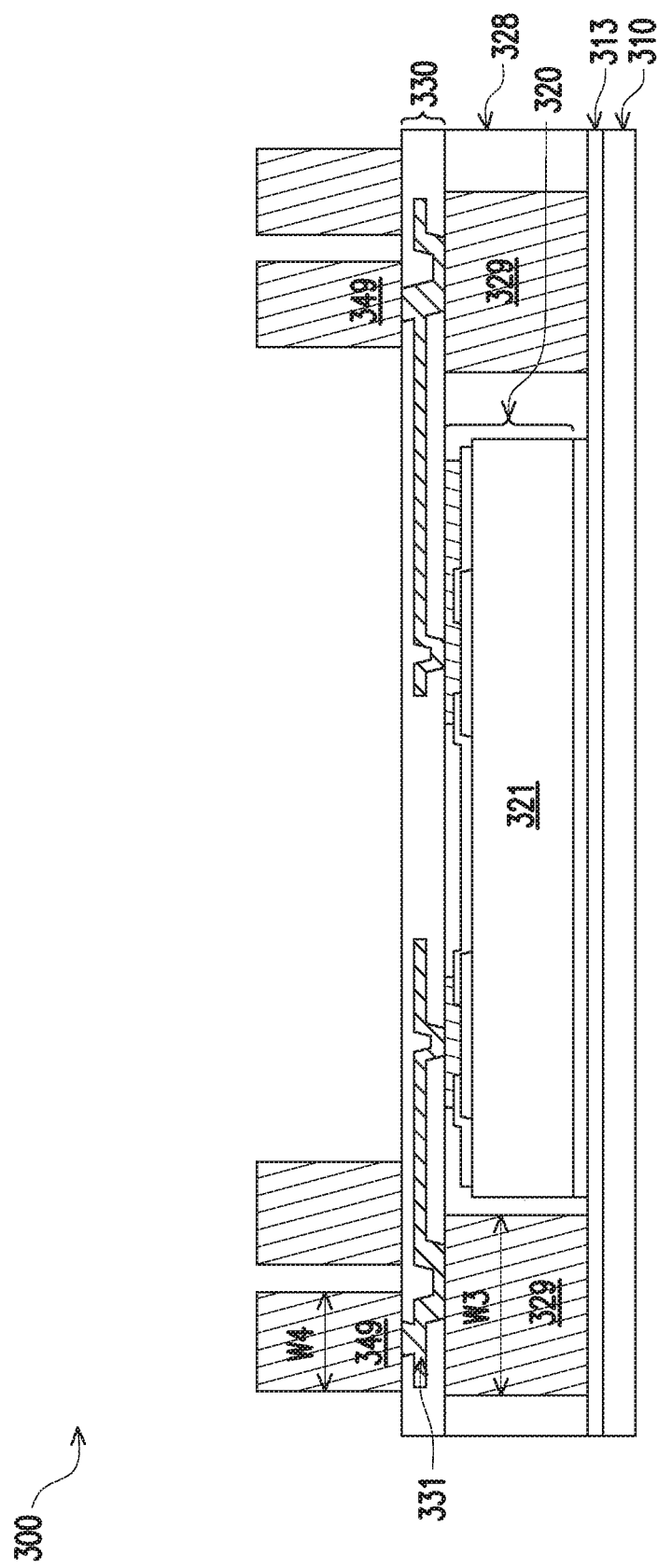

Referring to FIG. 11, vias 349 are formed over RDL 330. Vias 349 are electrically coupled to RDL 330, in some embodiments. In an embodiment, the material and formation method of vias 349 are similar to those of vias 269 in FIG. 5. In the illustrated embodiment, a width W3 of vias 329 is larger than a width W4 of vias 349, although W3 may also be equal to or smaller than W4 depending on, e.g., the aspect ratio of the photo resist used in forming the vias.

Figure 12:
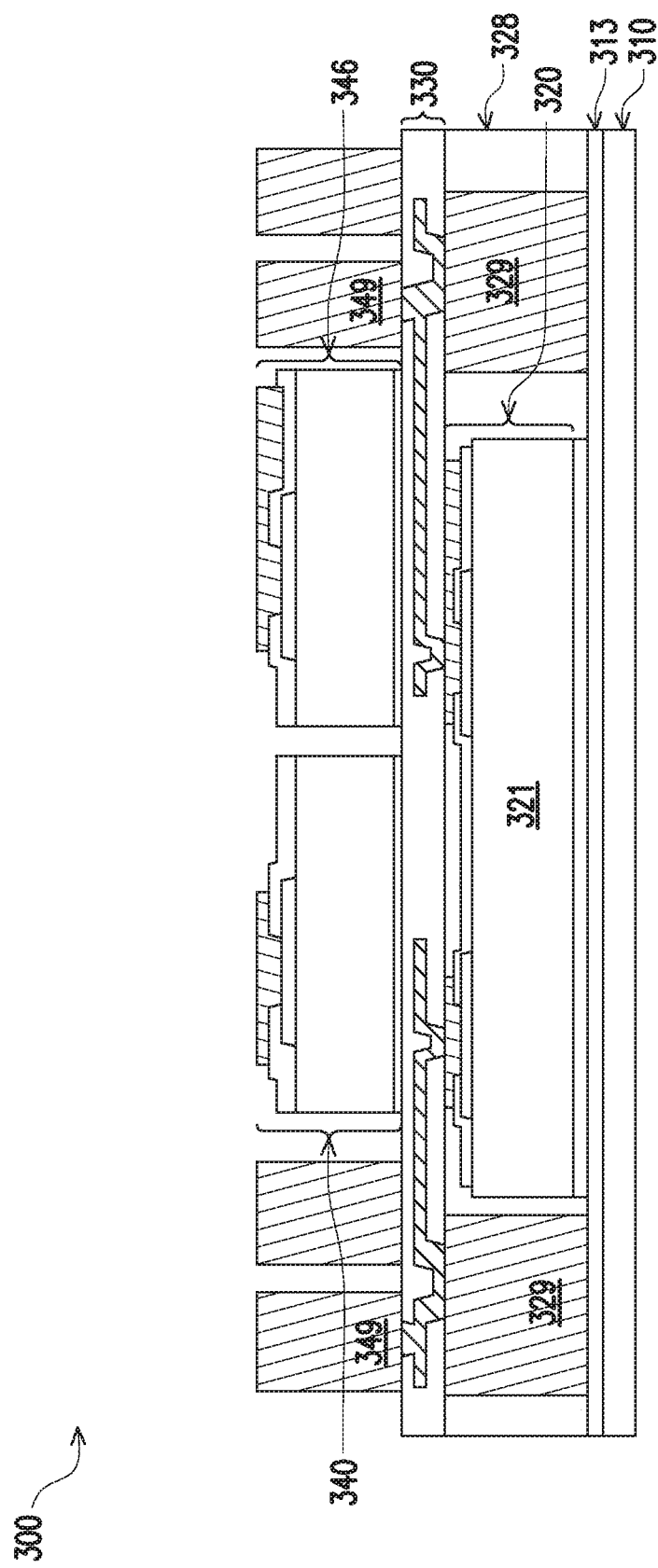

Next, as illustrated in FIG. 12, die 340 and die 346 are attached to RDL 330, each by a dielectric adhesive layer. In an embodiment, the material and formation method of the dielectric adhesive layer are similar to those of dielectric adhesive layer 211 in FIG. 2. As illustrated in FIG. 12, the active sides of die 340 and die 346 face away from RDL 330.

Figure 13:
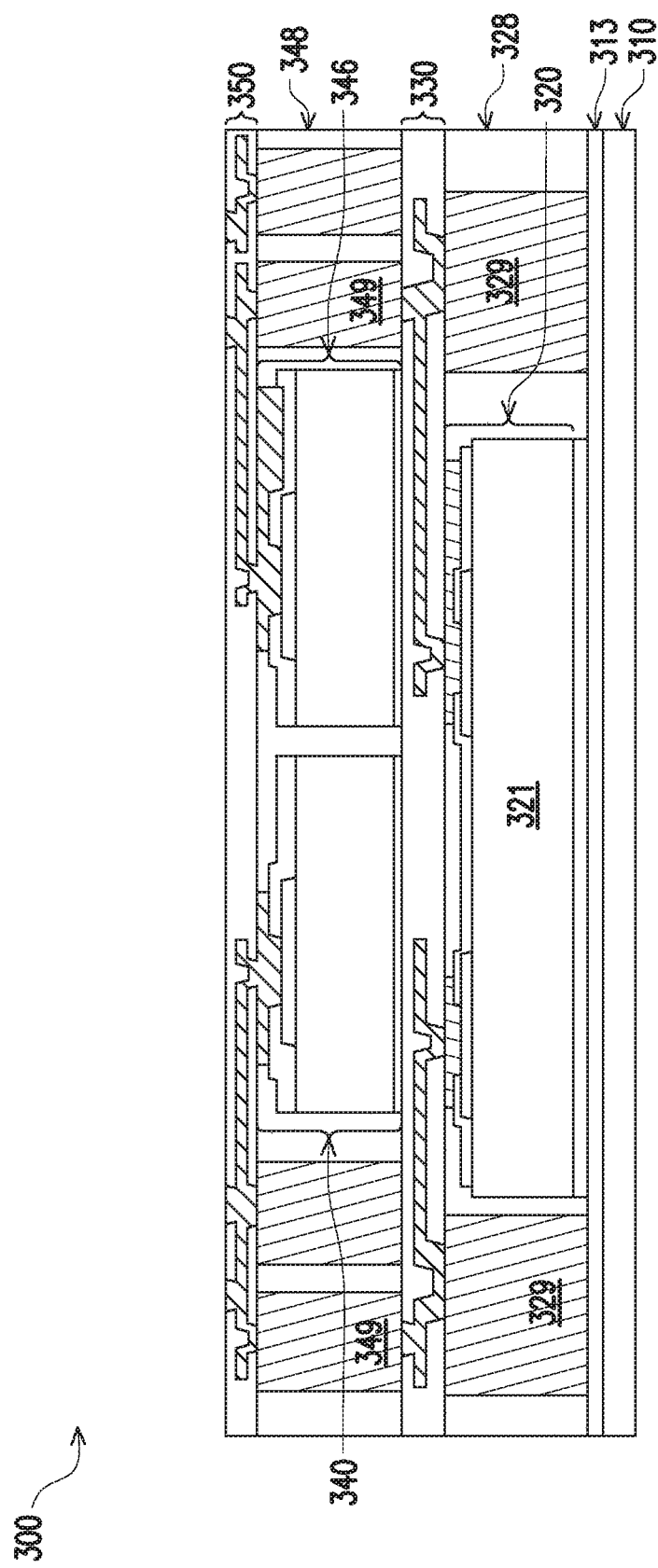

Next, as illustrated in FIG. 13, a second molding layer 348 is formed over RDL 330. The second molding layer 348 surrounds vias 349, die 340, and die 346. The second molding layer 348 may be cured after being deposited, and may further undergo a planarization process (e.g., a CMP process) to obtain a planar upper surface that is level with upper surfaces of vias 349, and the upper surfaces of die 340 and die 346. Subsequently, a RDL 350 is formed over the second molding layer 348, vias 349, die 340 and die 346. RDL 350 comprises conductive lines and/or conductive vias formed in one or more dielectric layers. In an embodiment, the material and formation method of RDL 350 are similar to those of RDL 250 in FIG. 5. RDL 350 is electrically coupled to vias 349, die 340 and die 346, and may provide electrical connection between die 340, die 346 and vias 349, in various embodiments.

Figure 14:
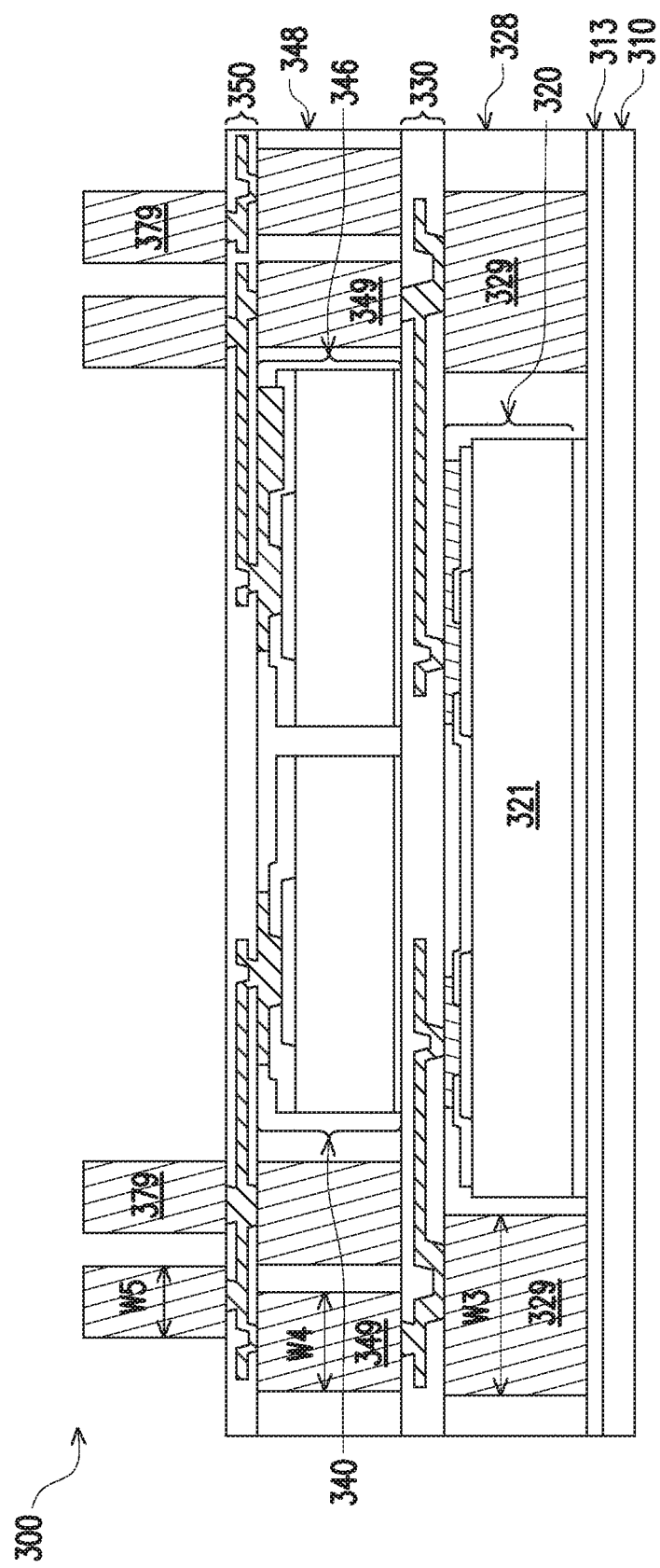

In FIG. 14, vias 379 are formed over RDL 350 and are electrically coupled to RDL 350. In an embodiment, the material and formation method of vias 379 are similar to those of vias 269 in FIG. 5. In some embodiments, a width W5 of vias 379 is smaller than or equal to a width W4 of vias 349 (W5≤W4). The width W4 of vias 349 is smaller than or equal to width W3 of vias 329 (W4≤W3), in some embodiments. In the illustrated embodiment, width W5 is smaller than width W4, and width W4 is smaller than width W3. For example, the width of vias in each molding layer (e.g., first molding layer 328, second molding layer 348 and third molding layer 388 (see FIG. 17)) may become successively smaller as each molding layer extends further away from dielectric layer 313. As another example, when vias 329 are used to couple with another package (e.g., package 400 in FIG. 19), width W3 of vias 329 may be larger than width W4 or width W5.

Figure 15:
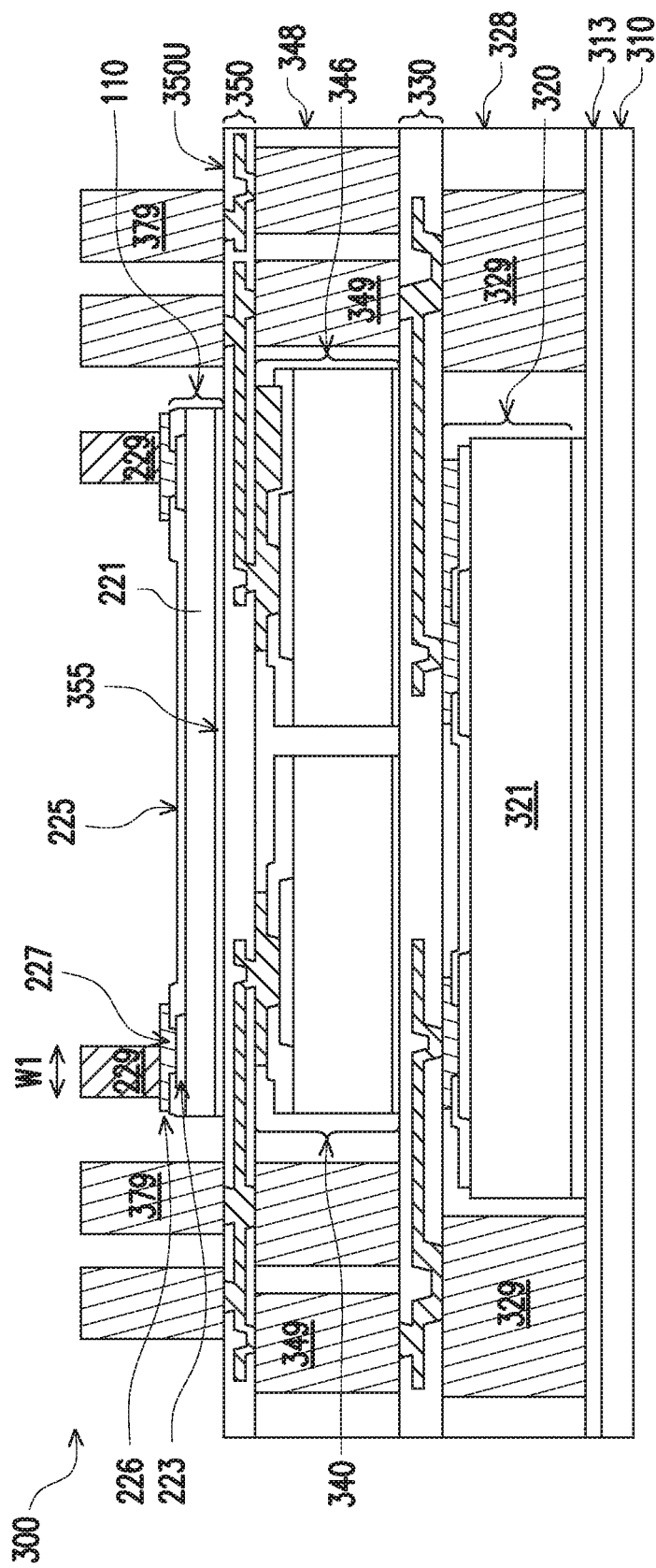

In FIG. 15, the TEM chip 110 is attached to RDL 350 by a dielectric adhesive layer 355 (e.g., a DAF). TEM chip 110 is disposed between vias 379, with the active side of TEM chip 110 facing away from RDL 350. Vertical connectors 229 are formed on the active side of TEM chip 110, and are electrically coupled to TEM chip 110 through, e.g., bonding pads 223 and conductive pads 227. In some embodiments, the center axis of vertical connectors 229 are not aligned with a center axis (e.g., a center axis extending along a direction perpendicular to the upper surface 350U of RDL 350) of bonding pads 223, and are shifted toward the perimeters (e.g., sidewalls) of TEM chip 110. This leaves more space in the center region of the upper surface of TEM chip 110 for attaching semiconductor die(s) in subsequent processing.

Figure 16:
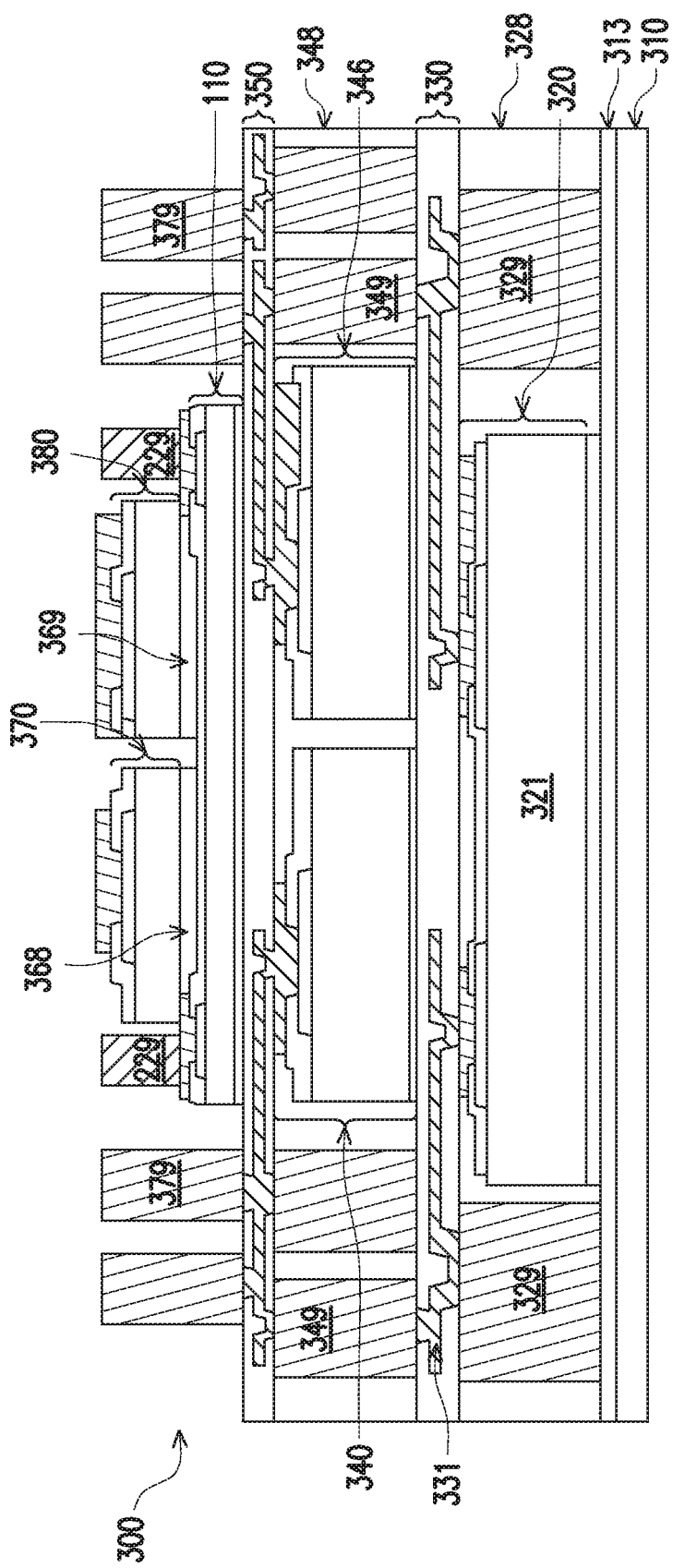

Next, referring to FIG. 16, semiconductor die 370 and semiconductor die 380 are attached to the upper surface of TEM chip 110 by dielectric adhesive layer 368 (e.g., a DAF) and dielectric adhesive layer 369 (e.g., a DAF), respectively. In an embodiment, the material and formation method of dielectric adhesive layer 368 and dielectric adhesive layer 369 are similar to those of dielectric adhesive layer 211 in FIG. 2. The active sides of semiconductor die 370 and semiconductor 380 face upwards (e.g., away from TEM chip 110).

Figure 17:
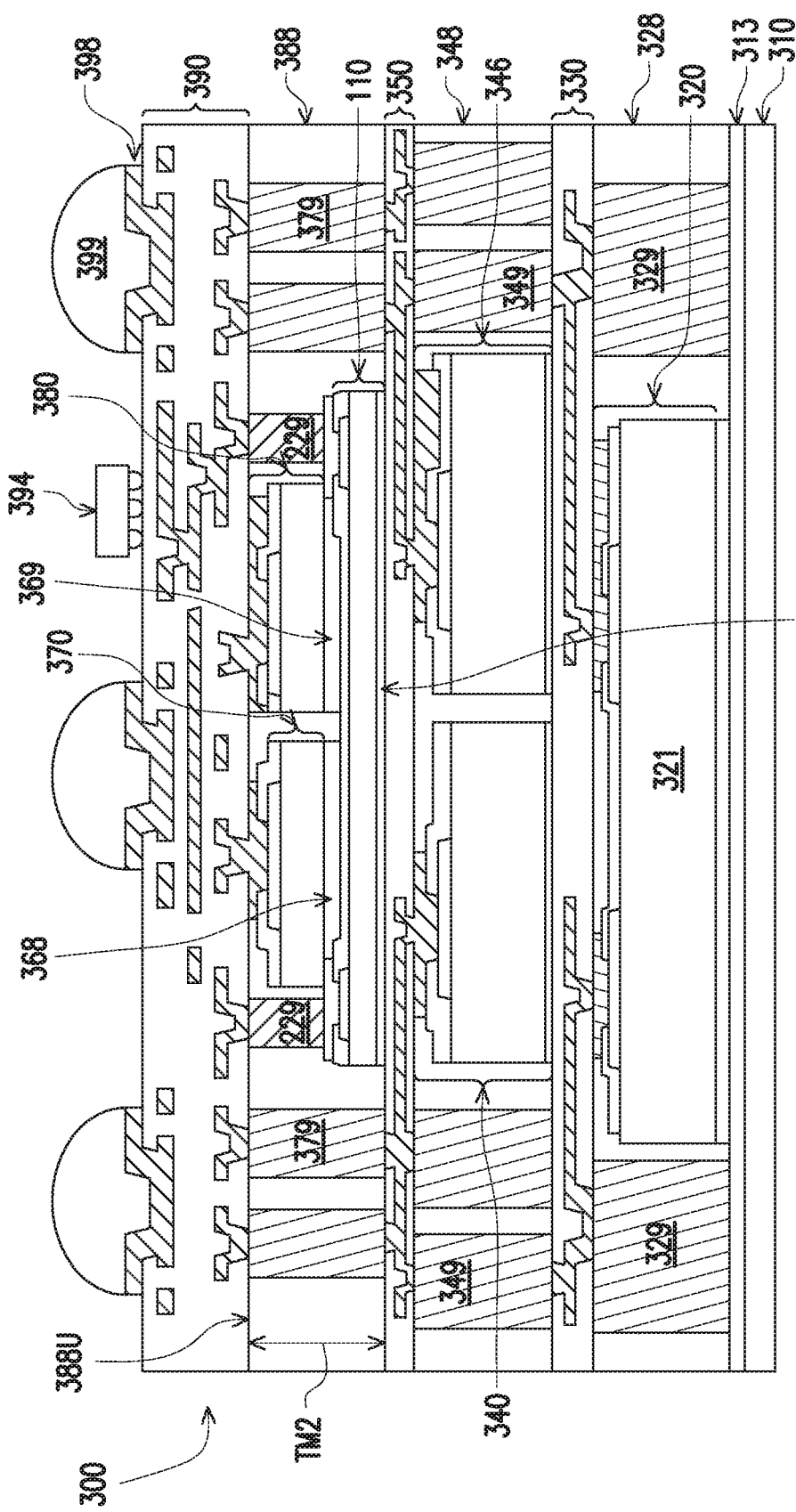

Next, in FIG. 17, a third molding layer 388 is formed over RDL 350. The third molding layer 388 surrounds vias 379, vertical connectors 229, TEM chip 110, die 370 and die 380. The third molding layer 388 may be cured after being deposited, and may further undergo a planarization process (e.g., a CMP process) to obtain a planar upper surface that is level with upper surfaces of vias 379, upper surfaces of vertical connectors 229, and upper surfaces of die 370 and die 380. In some embodiments, the thickness TM2 of the third molding layer 388 is equal to a sum of the thickness of TEM chip 110, the thickness of the die attached to TEM chip 110 (e.g., die 370 or die 380), the thickness of dielectric adhesive layer 355, and the thickness of a corresponding dielectric adhesive layer (e.g., dielectric adhesive layer 368 or dielectric adhesive layer 369), where the thicknesses are measured along the same direction as TM2. As illustrated in FIG. 17, an upper surface 388U of the third molding layer 388 is level with an upper surface of die 370, an upper surface of die 380, upper surfaces of vias 379 and upper surfaces of vertical connectors 229.

Subsequently, a RDL 390 is formed over the third molding layer 388, vias 379, vertical connectors 229, TEM chip 110, die 370 and die 380. RDL 390 comprises conductive features formed in one or more dielectric layers and may be similar to RDL 270 in FIG. 7. RDL 390 is electrically coupled to vias 379, TEM chip 110 (e.g., through vertical connectors 229), die 370 and die 380, and may provide electrical connection among TEM chip 110, die 370, die 380, and vias 379, in various embodiments. RDL 390 may comprise contact pads proximate the upper surface of RDL 390. In the illustrated embodiment, RDL 390 comprises UBM structures 398.

Connectors 399 are formed on UBM structures 398 and are electrically coupled to RDL 390, in some embodiments. Additionally, a surface device 394 may also be placed in contact with RDL 390 through conductive features (e.g., micro bump pads or UBM structures, not shown) that are electrically coupled to RDL 390. The surface device 394 may be used to provide additional functionality or programming to the semiconductor dies (e.g., die 370, die 380, die 340, die 346, and die 320), TEM chip 110, or the package 300 as a whole. In an embodiment the surface device 394 may be a surface mount device (SMD) or an integrated passive device (IPD) that comprises passive devices such as resistors, inductors, capacitors, jumpers, combinations of these, or the like that are desired to be connected to and utilized in conjunction with the semiconductor dies and TEM chip 110.

Figure 18:
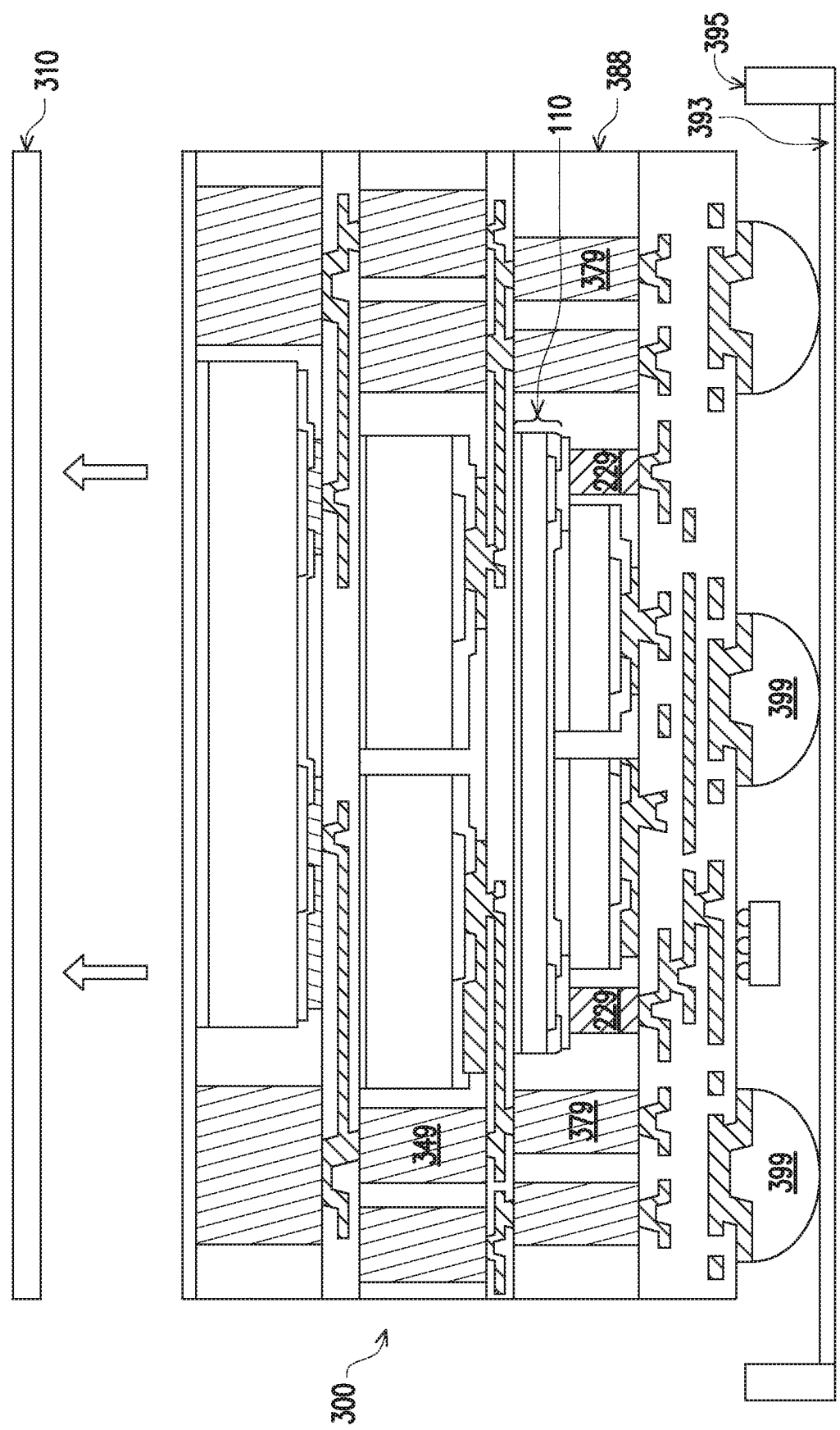

In FIG. 18, semiconductor package 300 in FIG. 17 is flipped over, and connectors 399 are attached to a tape 393 supported by a frame 395. Tape 393 may be a dicing tape, which may be adhesive, for holding semiconductor package 300 in place in subsequent processing. Carrier 310 is detached (de-bonded) from semiconductor package 300 through a de-bonding process. The de-bonding process may remove carrier 310 using any suitable process, such as etching, grinding, and mechanical peel off. In some embodiments, carrier 310 is de-bonded by shining a laser or UV light over the surface of carrier 310. The laser or UV light breaks the chemical bonds of the dielectric layer (e.g., the adhesive layer) that binds to carrier 310, and carrier 310 can then be easily detached. Although not shown, a dicing processing may be performed after the carrier de-bonding process to singulate the plurality of semiconductor packages formed over carrier 310 into individual MUST packages 300. After carrier de-bonding, semiconductor package 300 shown in FIG. 18 represents a MUST package with a TEM chip 110.

Figure 19:
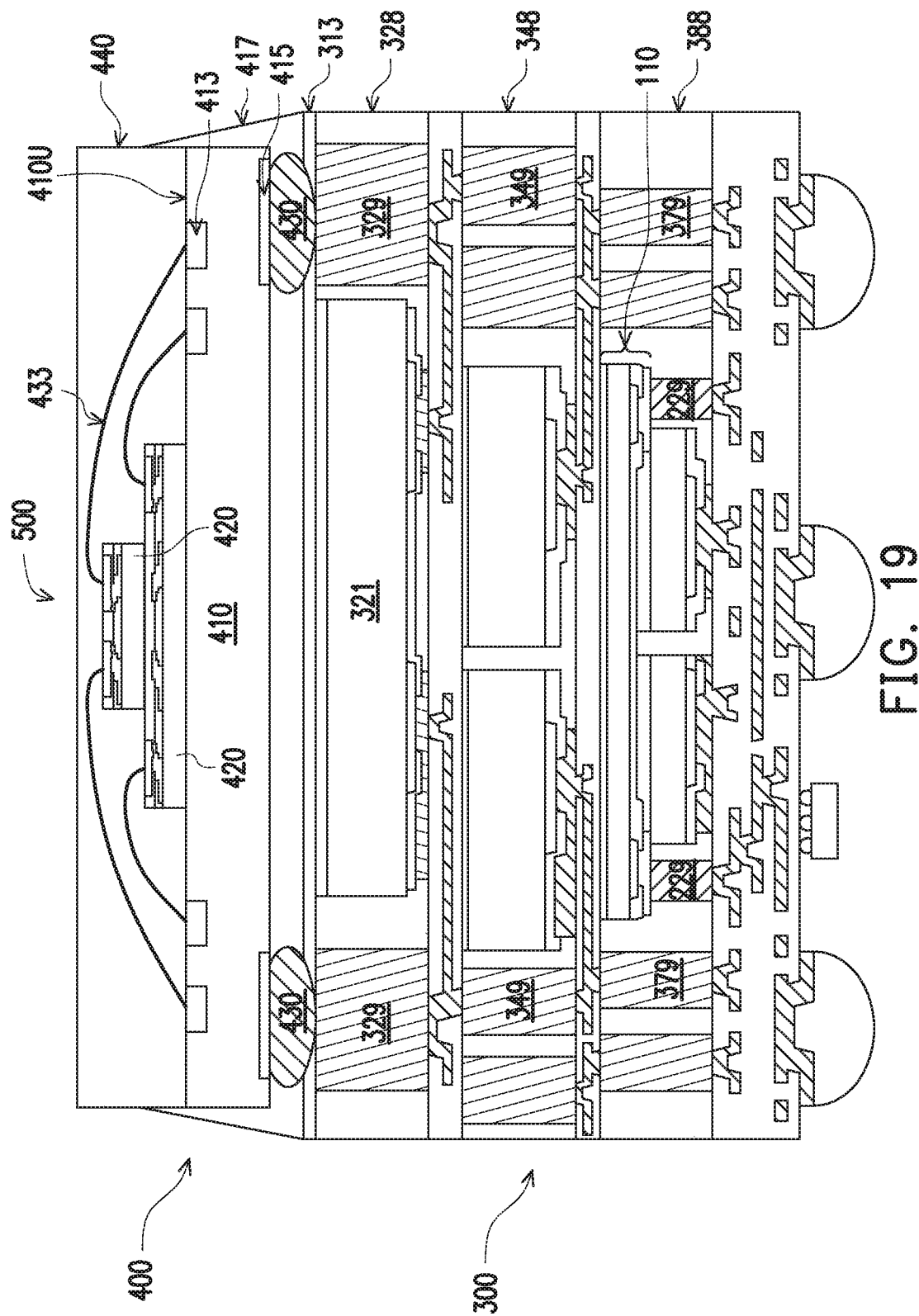
FIG. 19 illustrates a cross-sectional view of a multi-stacked package-on package (MUST-PoP) semiconductor package with a TEM chip, in accordance with an embodiment

In FIG. 19, another semiconductor package 400 is attached to the MUST package 300 shown in FIG. 18 to form a MUST-PoP package 500 with the TEM chip 110. Referring to FIG. 19, openings are formed through dielectric layer 313 of MUST package 300 to expose vias 329. The openings may be formed, for example, using laser drilling, etching, or the like. In some embodiments, solder paste may be deposited in the openings using, e.g., a solder printing machine. Next, another semiconductor package 400 is physically and electrically coupled to MUST package 300 through connectors 430 of semiconductor package 400. An underfill material 417 may be formed in the gap between semiconductor package 400 (may also be referred to as a top package) and semiconductor package 300 (may also be referred to as a bottom package). In other embodiments, to form MUST-PoP package 500 in FIG. 19, the plurality of MUST packages 300 formed over carrier 310 in FIG. 18 are not diced prior to attaching the top package 400. Instead, dicing may be performed after top packages 400 are attached to respective bottom packages 300.

As shown in FIG. 19, each top package 400 has one or more dies 420 mounted on an upper surface 410U of a substrate 410. In some embodiments, the semiconductor dies 420 include a plurality of dies stacked together. Semiconductor dies 420 may be of the same type, such as memory dies, or logic dies. Alternatively, semiconductor dies 420 may have different functionalities, with some being DSP dies, some being logic dies, and yet some others being memory dies, as examples. A molding layer 440 is formed on upper surface 410U of substrate 410 to encapsulate semiconductor dies 420. Contact pads or bonding pads of semiconductor dies 420 are connected to contact pads 413 on the upper surface 410U of substrate 410, using suitable methods such as bonding wires, bumps, or ball grid array (BGA) balls, in some embodiments. Substrate 410 comprises electrically conductive interconnect structures (not shown). Interconnect structures in substrate 410 are electrically coupled to contact pads 413 on upper surface 410U, and contact pads 415 on lower surface of substrate 410 opposing the upper surface 410U, in some embodiments. Connectors 430 are bonded to contact pads 415, in the illustrated embodiment. Connectors 430 may be any suitable connector, e.g., copper pillar (with a solder cap), solder balls, or the like.

Top package 400 is aligned with bottom package 300 so that the locations of external connectors 430 of top packages 400 match those of vias 329 of bottom package 300. After top package 400 is stacked on bottom package 300, a reflow process may be performed to physically and electrically couple connectors 430 with vias 329, in some embodiments. The reflow process may form a solder joint region between a connector 430 and a corresponding via 329. In cases where connectors 430 comprise solder balls, the reflow process may form a solder joint region between each contact pad 415 and a corresponding via 329.

Underfill material 417 may be optionally placed to fill the gap between top package 400 and bottom package 300. Example materials of the underfill material 417 include, but are not limited to, polymers and other suitable non-conductive materials. Underfill material 417 may be dispensed in the gap between top package 400 and bottom package 300 using, e.g., a needle or a jetting dispenser. A curing process may be performed to cure underfill material 417.

By using TEM chips (e.g., TEM chip 110) in the semiconductor package, warpage of the semiconductor package is reduced. Additionally, TEM chips help to reduce asymmetric package warpage due to high aspect ratio (e.g., aspect ratio larger than 1:1) of the semiconductor dies used in the package. Therefore, the reliability of the electrical connections of the semiconductor package and the yields of semiconductor manufacturing are improved. Since TEM chips have functional circuits inside, TEM chips could be used to implement various design functions to improve the integration density of the semiconductor package. In the embodiments where surface devices are used (see, e.g., surface device 394 in FIG. 17), TEM chips can be used to implement some or all of the functions of surface devices to reduce the number and/or areas of surface devices, and therefore, more surface area of the package is available for external connectors 399. For example, an original number (e.g., number without using TEM chip 110) of surface devices on a semiconductor package may be between about 10 and about 12, and each surface device may have a surface area of about 3 mm$^2$ or less, TEM chip 110 reduces the number of surface devices to about 10% to about 40% of the original number by implementing some or all of the functions of surface devices. As another example, TEM chip reduces the surface area of package 300 taken by surface devices to be about 5 mm$^2$ to about 20 mm$^2$ by implementing some or all of the functions of surface devices.

Figure 20:
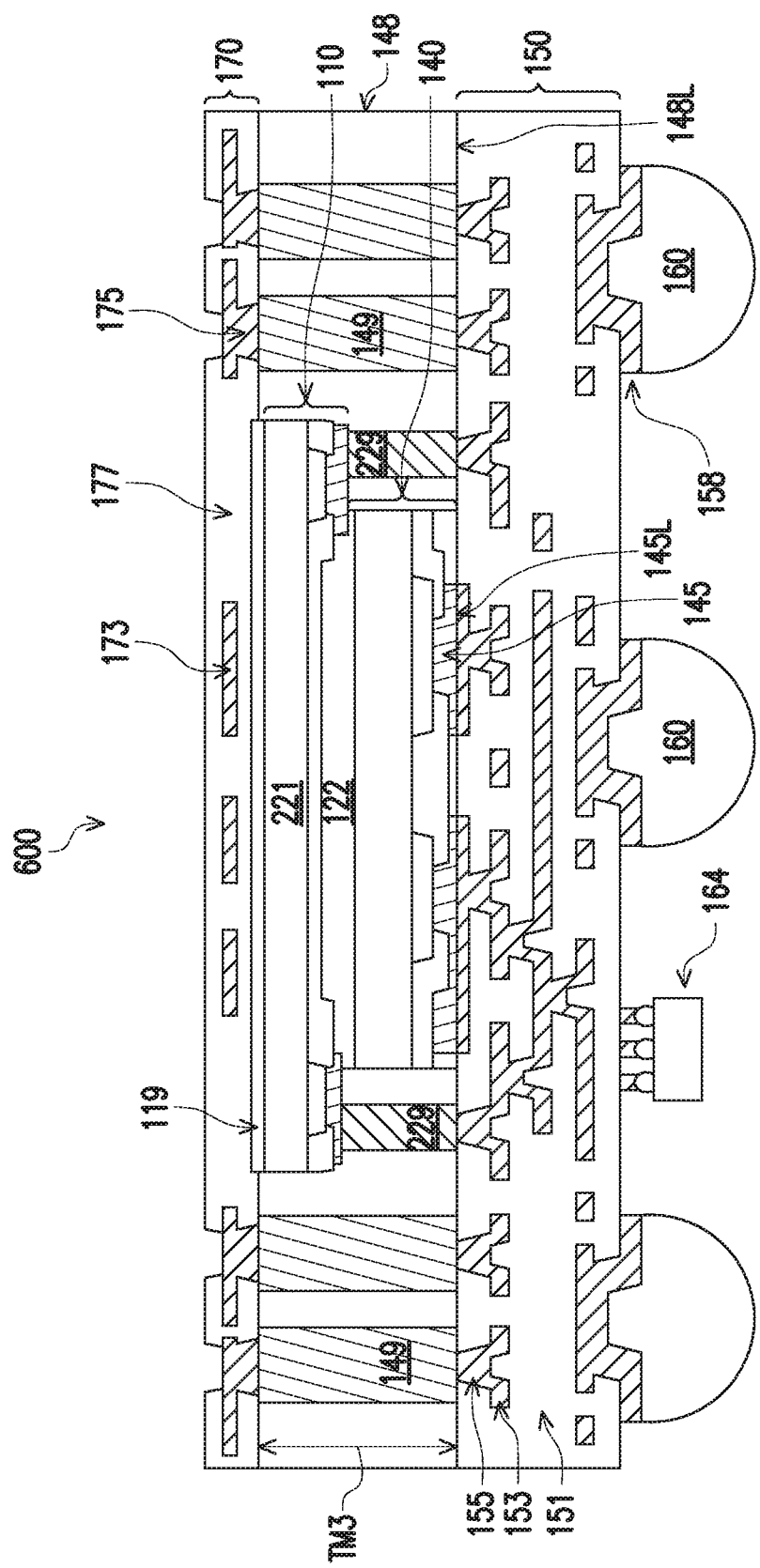
FIG. 20 illustrates a cross-sectional view of an integrated fan-out (InFO) package with a TEM chip, in accordance with an embodiment.

The embodiments illustrated in FIGS. 2-8, 9-18 and 19 show one TEM chip (e.g., TEM chip 110 in FIG. 19) in one molding layer (e.g., the third molding layer 388 in FIG. 19) as examples. However, TEM chip(s) could be used in any of the molding layers to reduce package warpage. For example, each of the first molding layer 328, the second molding layer 348, and the third molding layer 388 in FIG. 19 may have one or more TEM chips inside. In addition, the number of dies attached to the surface of each TEM chip may be one, two, or more, depending on factors such as the surface area of the TEM chip and the surface area(s) of the die(s) attached to the TEM chip. Various modifications to the illustrated embodiments described herein are possible without departing form the spirit of the present disclosure, and all of these modifications are fully intended to be included within the scope of the present disclosure.

FIG. 20 illustrates the cross-sectional view of an integrated fan-out (InFO) package 600 with the TEM chip 110, in accordance with an embodiment. As illustrated in FIG. 20, InFO package 600 includes the TEM chip 110, and the semiconductor die 140 with its inactive side attached to the active side of TEM chip 110. A molding layer 148 surrounds TEM chip 110, die 140, and vertical connectors 229 of TEM chip 110. Vias 149 may be optionally formed inside the molding layer 148, and extend from an upper surface of molding layer 148 to a lower surface of molding layer 148. In some embodiments, the thickness TM3 of molding layer 148 is equal to a sum of the thickness of TEM chip 110, the thickness of die 140, the thickness of dielectric adhesive layer 119, and the thickness of dielectric adhesive layer 122, where the thicknesses are measured along the same direction as TM3. As illustrated in FIG. 20, a lower surface 148L of molding layer 148 is level with a lower surface of die 140 (e.g., a lower surface 145L of die connector 145), lower surfaces of vias 149, and lower surfaces of vertical connectors 229.

A first RDL layer 150, comprising conductive lines 153 and/or vias 155 formed in one or more dielectric layers 151, is formed over the active side of the TEM chip, in some embodiments. The first RDL layer 150 is electrically coupled to TEM chip 110 (e.g., through vertical connectors 229), die 140, and vias 149, and may provide electrical connections among TEM chip 110, die 140 and vias 149, in some embodiments. Connectors 160 are formed on UBM structures 158 of the first RDL layer 150. One or more surface devices 164 are attached and electrically coupled to the first RDL layer 150, and are disposed between connectors 160, in the illustrated embodiment. An optional second RDL layer 170 is formed on the inactive side of TEM chip 110. If formed, the second RDL layer 170 may comprise conductive lines 173 and/or vias 175 formed in one or more dielectric layers 177, and may be electrically coupled to vias 149.

Figure 21:
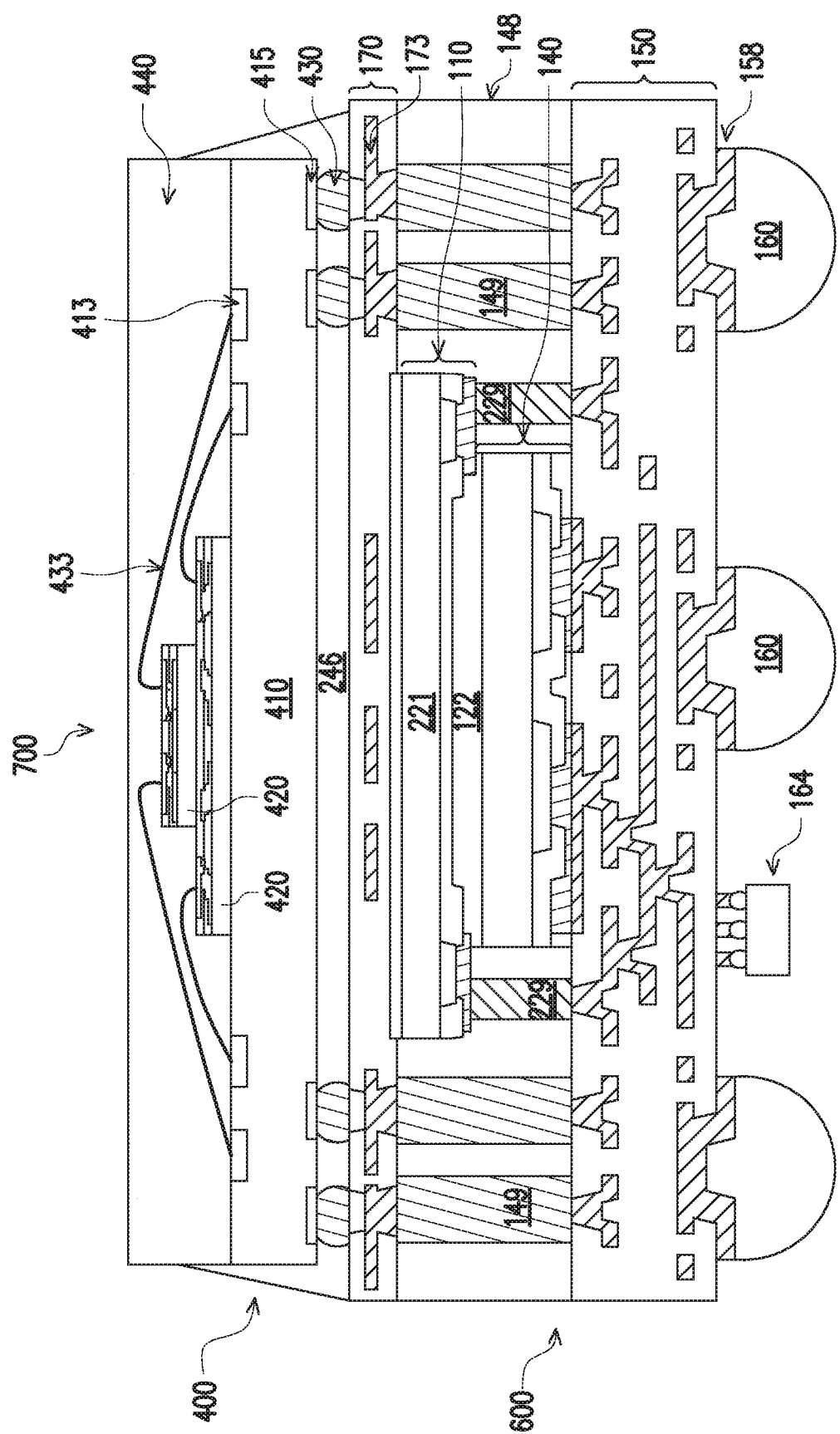
FIG. 21 illustrates a cross-sectional view of an integrated fan-out package-on-package (InFO-PoP) semiconductor package with a TEM chip, in accordance with an embodiment.

FIG. 21 illustrates the cross-sectional view of an integrated fan-out package-on-package (InFO-PoP) package 700 with the TEM chip 110, in accordance with an embodiment. As illustrated in FIG. 21, a top package 400 is mechanically and electrically coupled to InFO package 600 illustrated in FIG. 20 to form an InFO-PoP package 700. An underfill material 246 may be placed in the gaps between top package 400 and InFO package 600. Top package 400 in FIG. 21 may be similar to top package 400 in FIG. 19, thus details are not repeated here.

Figure 22:
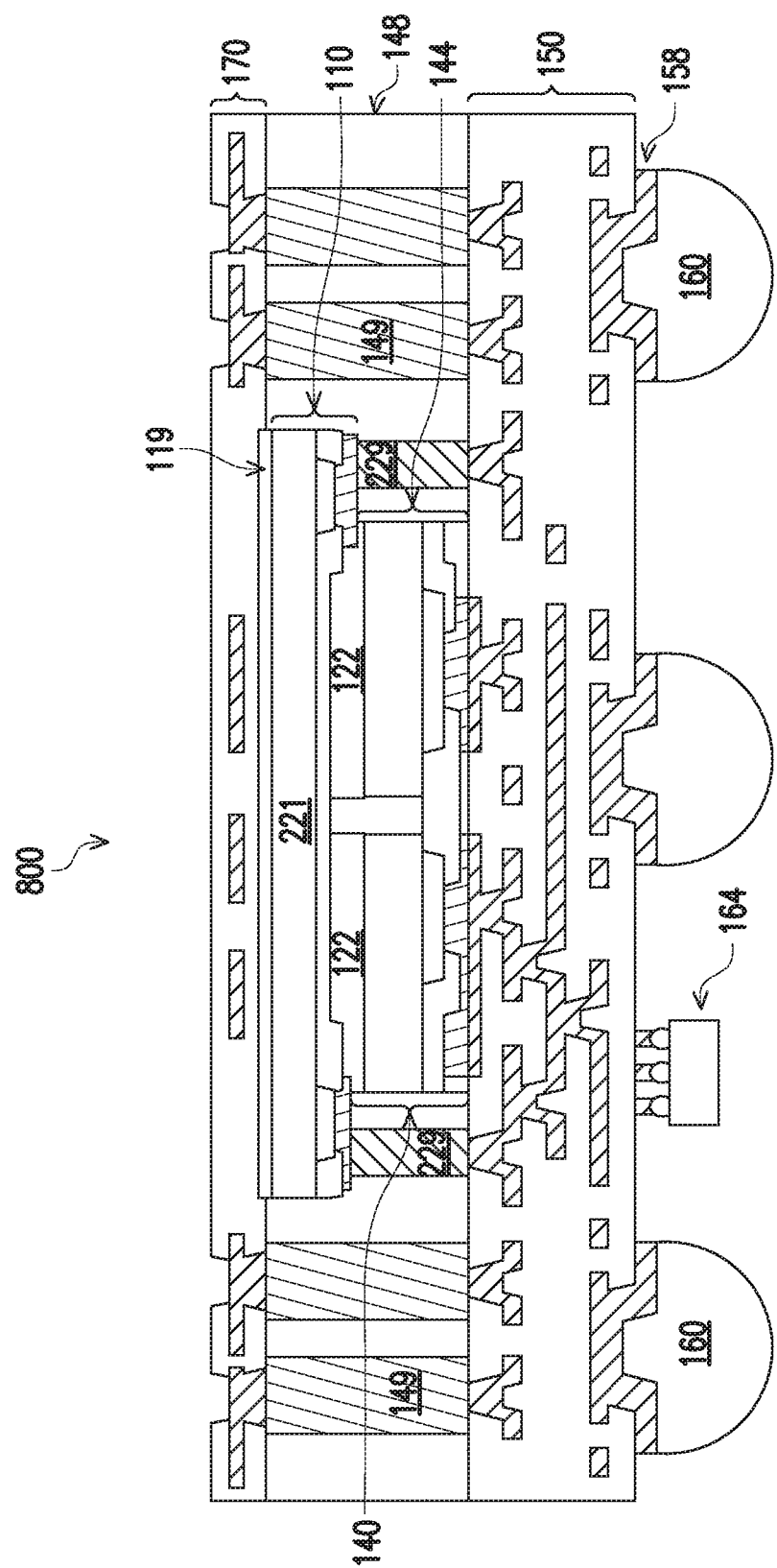
FIG. 22 illustrates a cross-sectional view of an integrated fan-out multi-chip (InFO-M) package with a TEM chip, in accordance with an embodiment.

FIG. 22 illustrates the cross-sectional view of an integrated fan-out multi-chip (InFO-M) package 800 with the TEM chip 110, in accordance with an embodiment. InFO-M package 800 in FIG. 21 is similar to InFO package 600 in FIG. 20, but with two semiconductor dies (e.g., die 140 and die 144) attached to TEM chip 110, instead of one die being attached to TEM chip 110. Details are similar to those described with reference to FIG. 20, thus are not repeated here. Various modifications to the embodiment of FIG. 21 are possible, e.g., more than two dies may be attached to TEM chip 110.

Figure 23:
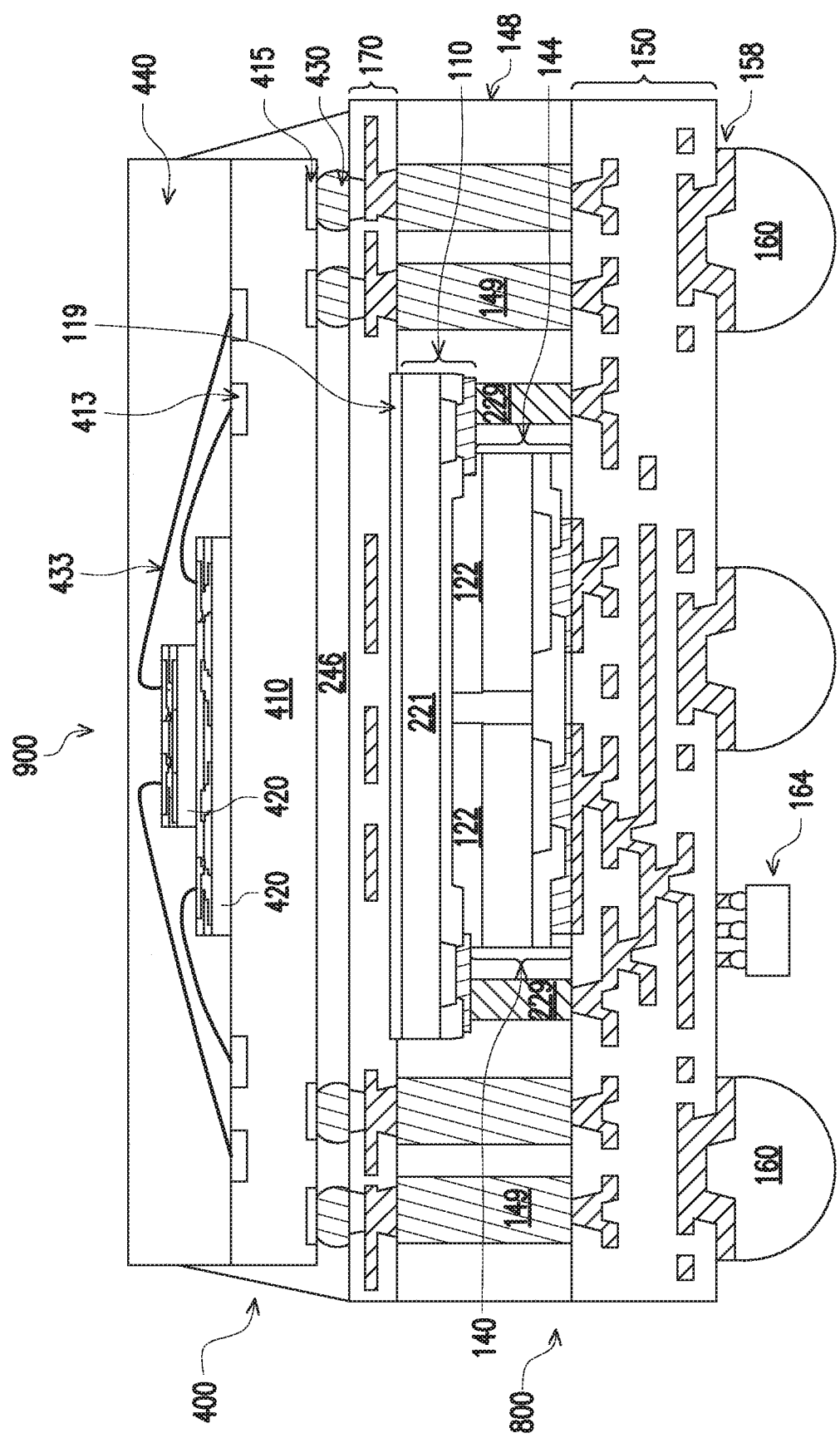
FIG. 23 illustrates a cross-sectional view of an integrated fan-out multi-chip package-on-package (InFO-M PoP) semiconductor package with a TEM chip, in accordance with an embodiment.

FIG. 23 illustrates the cross-sectional view of an integrated fan-out multi-chip package-on-package (InFO-M PoP) 900 with the TEM chip 110, in accordance with an embodiment. As illustrated in FIG. 23, the top package 400 is mechanically and electrically coupled to InFO-M package 800 illustrated in FIG. 22 to form an InFO-M PoP package 900. An underfill material 246 may be placed in the gaps between top package 400 and InFO-M package 800. Top package 400 in FIG. 23 may be similar to top package 400 in FIG. 19, thus details are not repeated here.

Figure 24:
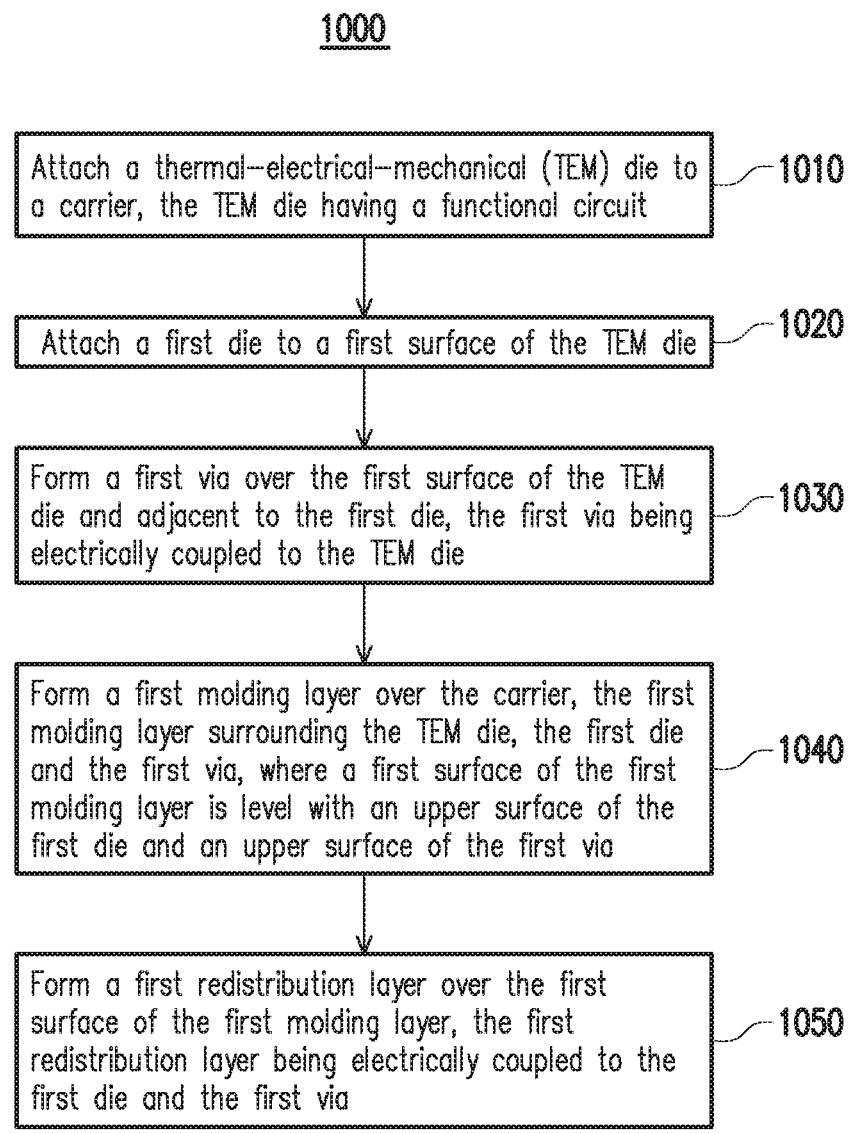
FIG. 24 illustrates a flow chart of a method for forming semiconductor packages, in accordance with an embodiment.

FIG. 24 illustrates a flow chart of a method 1000 for fabricating a semiconductor structure, in accordance with some embodiments. It should be understood that the embodiment method shown in FIG. 24 is merely an example of many possible embodiment methods. One of ordinary skill in the art would recognize many variations, alternatives, and modifications. For example, various steps as illustrated in FIG. 24 may be added, removed, replaced, rearranged and repeated.

As illustrated in FIG. 24, at step 1010, a thermal-electrical-mechanical (TEM) die to is attached a carrier, the TEM die having a functional circuit. At step 1020, a first die is attached to a first surface of the TEM die. At step 1030, a first via is formed over the first surface of the TEM die and adjacent to the first die, the first via being electrically coupled to the TEM die. At step 1040, a first molding layer is formed over the carrier, the first molding layer surrounding the TEM die, the first die and the first via, where the first surface of the first molding layer is level with an upper surface of the first die and an upper surface of the first via. At step 1050, a first redistribution layer is formed over the first surface of the first molding layer, the first redistribution layer being electrically coupled to the first die and the first via.

Advantageous features of some embodiments described herein may include the ability to mitigate asymmetric warpage and improved control over component warpage. The large rigid TEM chip (e.g., TEM chip 110 in FIGS. 1A/1B) with low CTE will dominate (e.g., compensate, ameliorate, or even prevent) wafer warpage of the semiconductor package. Since the TEM chip takes up space in the semiconductor package and reduces the volume of the molding layer, and since molding layer may have large CTE, TEM chip may reduce the warpage by reducing the volume of molding layer in the package. For dies (e.g., die 120 in FIGS. 1A/1B) with asymmetric dimension (e.g., a non-square shape such as a rectangular shape), asymmetric package warpage may occur. A TEM chip with symmetric dimensions (e.g., a square shape) may be used in the semiconductor package for attaching dies with asymmetric dimensions, thus reducing asymmetric package warpage. Since TEM chip includes functional circuit, more functions can be integrated into the semiconductor package, thus improving integration density and reducing cost. Another advantageous feature of some embodiments may include the ability to provide for initial warpage adjustment. As another example, TEM chip may be used to integrated passive components previously integrated by surface devices. This reduces the numbers and/or areas of surface devices used in the semiconductor package, thus leaving more space (e.g., surface area) for more external connectors.

In some embodiments, a device includes a thermal-electrical-mechanical (TEM) chip having a functional circuit, a first die attached to a first side of the TEM chip, and a first via on the first side of the TEM chip and adjacent to the first die, the first via being electrically coupled to the TEM chip. The device also includes a first molding layer surrounding the TEM chip, the first die and the first via, where an upper surface of the first die and an upper surface of the first via are level with an upper surface of the first molding layer. The device further includes a first redistribution layer over the upper surface of the first molding layer and electrically coupled to the first via and the first die.

In other embodiments, a semiconductor package includes a thermal-electrical-mechanical (TEM) die embedded in a first molding layer, the TEM die having a first bonding pad on a first side of the TEM die, a vertical connector in the first molding layer and on the first side of the TEM die, where the vertical connector is electrically coupled to the first bonding pad, and extends from the first side of the TEM die to a first side of the first molding layer. The semiconductor package also includes a first semiconductor die in the first molding layer and on the first side of the TEM die, where the first semiconductor die has a second bonding pad on a first side of the first semiconductor die, where a second side of the first semiconductor die opposing the first side of the first semiconductor die is facing the first side of the TEM die. The semiconductor package further includes a first redistribution layer on the first side of the first molding layer and electrically coupled to the vertical connector and the second bonding pad.

In yet another embodiment, a method includes attaching a thermal-electrical-mechanical (TEM) die to a carrier, the TEM die having a functional circuit, forming a first via over a first surface of the TEM die, the first via being electrically coupled to the TEM die, and attaching a first die to the first surface of the TEM die and adjacent to the first via. The method also includes forming a first molding layer over the carrier, the first molding layer surrounding the TEM die, the first die and the first via, where a first surface of the first molding layer is level with an upper surface of the first die and an upper surface of the first via. The method further includes forming a first redistribution layer over the first surface of the first molding layer, the first redistribution layer being electrically coupled to the first die and the first via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    attaching a first die to a first side of a thermal-electrical-mechanical (TEM) chip, the TEM chip having a functional circuit and a 1:1 aspect ratio in a top view;
    forming a first via on the first side of the TEM chip and adjacent to the first die, the first via being electrically coupled to the TEM chip;
    forming a first molding layer around the TEM chip, the first die and the first via, wherein an upper surface of the first die and an upper surface of the first via are level with an upper surface of the first molding layer;
    forming a first redistribution layer (RDL) over the upper surface of the first molding layer, wherein the first RDL is electrically coupled to the first via and the first die;
    forming a second via in the first molding layer and extending from the upper surface of the first molding layer to a lower surface of the first molding layer opposing the upper surface, wherein the second via is electrically coupled to the first RDL and has a first width;
    forming a second RDL on a second side of the TEM chip opposing the first side of the TEM chip, wherein the second via is electrically coupled to the second RDL;
    attaching a second die to the second RDL, wherein the second RDL is between the second die and the TEM chip;
    forming a second molding layer around the second die;
    forming a third via in the second molding layer, the third via electrically coupled to the second RDL and having a second width;
    forming a third RDL on the second molding layer such that the second molding layer is between the third RDL and the second RDL, the third RDL being electrically coupled to the third via;
    forming a third molding layer on the third RDL, the third RDL being disposed between the third molding layer and the second molding layer; and
    forming a fourth via in the third molding layer, the fourth via being electrically coupled to the third RDL and having a third width, wherein the first width, the second width, and the third width are different, and wherein sidewalls of the third via are disposed between opposing sidewalls of the fourth via.

2. The method of claim 1, wherein the TEM chip has a bonding pad on the first side of the TEM chip and a conductive path extending along the first side of the TEM chip, the conductive path in physical contact with the bonding pad, wherein forming the first via comprises forming the first via over and in physical contact with the conductive path.

3. The method of claim 1, wherein a surface area of the TEM chip is about 1.1 times and about 5 times a surface area of the first die.

4. The method of claim 3, wherein a volume of the TEM chip is between about 50% and about 90% of a total volume of the semiconductor device.

5. The method of claim 1, further comprising:
    attaching a semiconductor package to the fourth via; and
    forming a plurality of conductive bumps over and electrically coupled to the first RDL.

6. The method of claim 1, further comprising:
    attaching a third die to the first side of the TEM chip, wherein the third die is laterally adjacent to the first die and is electrically coupled to the first RDL, wherein the first die and the third die are disposed within perimeters of the TEM chip in the top view.

7. The method of claim 1, wherein the third width is larger than the second width, and the second width is larger than the first width.

8. The method of claim 7, further comprising forming a fifth via in the second molding layer adjacent to the third via, the third via electrically coupled to the second RDL and the third RDL, wherein a first portion of the fifth via is disposed within lateral extents of the fourth via, and a second portion of the fifth via is disposed outside the lateral extents of the fourth via.

9. The method of claim 8, wherein the fifth via is formed to have a same width as the third via.

10. The method of claim 1, further comprising attaching a third die to the third RDL before forming the third molding layer on the third RDL.

11. A method of forming a semiconductor device, the method comprising:
    forming a first via over a first surface of a TEM die, the TEM die having a functional circuit and a 1:1 aspect ratio in a top view, the TEM die having a bonding pad at the first surface of the TEM die, the TEM die having a conductive path connected to the bonding pad, the conductive path extending along the first surface of the TEM die from the bonding pad toward a sidewall of the TEM die, the first via being electrically coupled to the conductive path of the TEM die;

attaching a first die to the first surface of the TEM die, the first die being laterally adjacent to the first via;

forming a first molding layer around the TEM die, the first die and the first via, wherein a first surface of the first molding layer is level with an upper surface of the first die and an upper surface of the first via;

forming a second via in the first molding layer, wherein a height of the second via is a same as a thickness of the first molding layer;

forming a first redistribution layer (RDL) over the first surface of the first molding layer, the first RDL being electrically coupled to the first die, the first via, and the second via;

forming a second RDL on a second surface of the first molding layer opposing the first surface of the first molding layer, the second RDL being electrically coupled to the second via;

attaching a second die to the second RDL, the second RDL being disposed between the second die and the TEM die;

forming a second molding layer on the second RDL around the second die;

forming a third via and a fourth via in the second molding layer and electrically coupled to the second RDL;

forming a third RDL on the second molding layer, the second die being disposed between the third RDL and the second RDL;

forming a third molding layer on the third RDL, the third RDL being disposed between the third molding layer and the second molding layer; and forming a fifth via in the third molding layer and electrically coupled to the third RDL, wherein the third via is disposed within lateral extents of the fifth via, wherein a first portion of the fourth via is disposed outside the lateral extents of the fifth via, and a second portion of the fourth via is disposed within the lateral extents of the fifth via.

12. The method of claim 11, wherein a width of the second via is larger than a width of the first via.

13. The method of claim 11, further comprising mechanically and electrically coupling a semiconductor package to the fifth via.

14. The method of claim 11, wherein the fifth via has a width larger than that of the third via, and the third via has a width that is larger than that of the second via.

15. The method of claim 14, wherein the third via and the fourth via have a same width.

16. The method of claim 11, further comprising forming conductive connectors that are electrically and mechanically coupled to the first RDL.

17. The method of claim 16, further comprising attaching a surface-mount device (SMD) to the first RDL and between the conductive connectors, wherein the conductive connectors extend further from the first RDL than the SMD.

18. A method of forming a semiconductor device, the method comprising:

forming a vertical connector on a first side of a thermal-electrical-mechanical (TEM) die, the TEM die having a first bonding pad on the first side of the TEM die, the vertical connector being electrically coupled to the first bonding pad;

attaching a first side of a first semiconductor die to the first side of the TEM die using a dielectric film, the first semiconductor die being laterally adjacent to the vertical connector, the first semiconductor die having a second bonding pad on an opposing second side of the first semiconductor die;

embedding the TEM die, the dielectric film, the first semiconductor die and the vertical connector in a first molding layer, a first side of the first molding layer being level with an upper surface of the vertical connector;

forming a first redistribution layer (RDL) on the first side of the first molding layer, the vertical connector and the second bonding pad being electrically coupled to the first RDL;

forming a first via in the first molding layer and adjacent to the TEM die, wherein the first via extends from the first side of the first molding layer to a second side of the first molding layer opposing the first side of the first molding layer;

forming a second RDL on the second side of the first molding layer, wherein the first via is electrically coupled to the first RDL and the second RDL;

attaching a second semiconductor die to the second RDL such that the second RDL is between the second semiconductor die and the first semiconductor die;

forming a second molding layer on the second RDL and around the second die;

forming a second via in the second molding layer adjacent to the second die, the second via being electrically coupled to the second RDL;

forming a third RDL on the second molding layer such that the second molding layer is between the third RDL and the second RDL;

forming a third molding layer on the third RDL such that the third RDL is between the third molding layer and the second molding layer; and forming a third via in the third molding and electrically coupled to the third RDL, wherein opposing sidewalls of the second via are disposed within opposing sidewalls of the third via.

19. The method of claim 18, wherein the first semiconductor die is disposed within a boundary of the TEM die in a top view, wherein a surface area of the TEM die is about 1.1 times to about 5 times a surface area of the first semiconductor die.

20. The method of claim 18, wherein a first width of the first via is smaller than a second width of the second via, and the second width of the second via is smaller than a third width of the third via.

* * * * *